(12) United States Patent
Shoji

(10) Patent No.: US 7,589,612 B2
(45) Date of Patent: Sep. 15, 2009

(54) CURRENT SENSOR

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 534 days.

(21) Appl. No.: 11/340,683

(22) Filed: Jan. 27, 2006

(65) Prior Publication Data

US 2006/0170529 A1 Aug. 3, 2006

(30) Foreign Application Priority Data

Jan. 31, 2005 (JP) ............................. 2005-022849

(51) Int. Cl.
*H01L 43/00* (2006.01)
(52) U.S. Cl. ................................ 338/32 R; 324/117 R
(58) Field of Classification Search ................ 338/32 R
See application file for complete search history.

(56) References Cited

U.S. PATENT DOCUMENTS 5,621,377 A 4/1997 Dettmann et al.
7,259,545 B2 * 8/2007 Stauth et al. ............ 324/117 R
2002/0041514 A1 * 4/2002 Scheler et al. .............. 365/158

* cited by examiner

*Primary Examiner*—Elvin G Enad
*Assistant Examiner*—Joselito Baisa
(74) *Attorney, Agent, or Firm*—Oliff & Berridge, PLC

(57) ABSTRACT

A current sensor that is compact can detect with high sensitivity and high accuracy a magnetic field generated by a current. The current sensor has a thin film coil including turn portions extending in an X-axis direction at a second layer, and a first magnetoresistive element which includes element patterns disposed at a first layer in areas corresponding to the turn portions, the resistance value of which varies according to a magnetic field generated by a current detected of from 10 to 50 mA flowing through the turn portions. The distance between each turn portion and each element pattern is from 0.4 to 1.0 μm. Each cross-sectional area at the turn portions is from 0.4 to 3.0 μm². This permits efficient detection of a magnetic field without the influence of heat generated from the thin film coil.

32 Claims, 18 Drawing Sheets

CURRENT SENSOR

BACKGROUND OF THE INVENTION

1. Field of the Invention

The present invention relates to a small current sensor capable of sensing with high sensitivity a change in the current flowing through a conductor.

2. Description of the Related Art

Generally, as a way to accurately sense a weak control current flowing through a circuit of control equipment, resistors are connected in series in the circuit and a voltage drop in the resistors is measured. In this way, however, a load different from that in a control system is applied, which might exert an influence on the control system. For this reason, there is employed an indirect measuring method in which the gradient of a magnetic field generated by a control current is detected. Specifically, a line to be measured is wound around a toroidal core, and a control current is then supplied to the line measured, thereby detecting a magnetic flux generated in the center portion of the toroidal core by Hall element.

However, problems with such a current sensor employing the above method such as the difficulty of miniaturization and the insufficiency of linearity or high frequency responsiveness have been pointed out. For this reason, a current sensor has been proposed in which a giant magnetoresistive element (hereinafter referred to as a GMR element) that produces giant magnetoresistive effect is disposed in a magnetic field in order to detect the gradient (see, for example, U.S. Pat. No. 5,621,377). A current sensor using such a GMR element can improve detection sensitivity and responsiveness, and also exhibit detection characteristics that are stable against temperature changes.

SUMMARY OF THE INVENTION

Recently, there have been demands for a current sensor capable of detecting a weaker current and having a more compact general configuration. In a conventional current sensor using a GMR element, however, the GMR element is disposed adjacent to a line to be measured in an in-plane direction. This makes it difficult to detect a weak current. This is also unfavorable to the miniaturization.

The present invention has been achieved in consideration of the above problems, and it is desirable to provide a current sensor that is compact and capable of detecting a magnetic field generated by a current with high sensitivity and high accuracy.

A first current sensor of the invention detects a current in the range of 10 mA to 50 mA, and includes the following components: a first conductor which has a first extended portion extending in a first direction in a first layer and being supplied with a current; and a first magnetoresistive element which is disposed at an area corresponding to the first extended portion in a second layer, a resistance value of the first magnetoresistive element varying according to a first magnetic field generated by a current flowing through the first extended portion. In addition, the current sensor satisfies the following conditional expressions (1) and (2):

$$0.4\ \mu m \leq D1 \leq 1.0\ \mu m \quad (1)$$

$$0.4\ \mu m^2 \leq S1 \leq 3.0\ \mu m^2 \quad (2)$$

where D1 is a distance between a first extended portion and a first magnetoresistive element; and S1 is an area of a cross section orthogonal to a first direction in the first extended portion.

A second current sensor of the invention detects a current in the range of 3 mA to 50 mA, and includes a first conductor and a first magnetoresistive element as described above. In addition, the current sensor satisfies the following conditional expressions (3) and (4):

$$0.2\ \mu m \leq D1 \leq 0.4\ \mu m \quad (3)$$

$$0.4\ \mu m^2 \leq S1 \leq 2.5\ \mu m^2 \quad (4)$$

where D1 and S1 are as described above.

In the first and second current sensors, the first conductor and the first magnetoresistive element are disposed in different layers. Therefore, they can be disposed closer than if disposed in the same layer, thereby reducing the overall dimension. Moreover, the first magnetic field based on a current flowing through the first extended portion can be applied more strongly on the first magnetoresistive element. In particular, since the conditional expressions (1) and (2), or the conditional expressions (3) and (4) are satisfied, the first magnetoresistive element is less subjected to the influence of heat generated in the first conductor, so that the first magnetic field can be applied efficiently on the first magnetoresistive element.

This permits a compact configuration and efficient detection of the first magnetic field with reduced influence of heat generated from the first conductor. Therefore, a relatively weak current flowing through the first conductor, which is from 10 mA to 50 mA (on the first current sensor), or from 3 mA to 50 mA (on the second current sensor) can be measured with high accuracy and high sensitivity.

Preferably, the first magnetoresistive element has a plurality of element patterns which extend in a first direction and are disposed adjacent each other in a second direction orthogonal to the first direction. Preferably, the first conductor is a first thin film coil which winds in the first layer while including a plurality of turn portions as a first extended portion extending in the first direction in correspondence with the element patterns of the first magnetoresistive element, and which applies a first magnetic field on each of the element patterns of the first magnetoresistive element under the supply of a current. In this case, the element patterns in the first magnetoresistive element may be connected to each other in parallel or in series.

Especially, when the individual element patterns in the first magnetoresistive element are connected in parallel, the whole resistance value can be held relatively low without decreasing the resistance change rate of the first magnetoresistive element. This reduces the calorific value of the first magnetoresistive element in use. In addition, the influence due to noise (undesired magnetic field) can be reduced to improve an S/N ratio. On the other hand, when the individual element patterns in the first magnetoresistive element are connected in series to each other, the whole extension length of the element patterns functioning as a magnetosensitive part increases without increasing the size in the first direction. This further increases the absolute value of the whole resistance value (impedance) in the first magnetoresistive element. This permits higher-accurate measurement of a weak current.

In an alternative, the first and second current sensor may further include a second conductor disposed in a third layer positioned on a side opposite to a first layer with respective to a second layer, the second conductor has a second extended portion extending in a first direction in correspondence with the first magnetoresistive element and generating a second magnetic field through the current supplied, the second magnetic field then applied on the first magnetoresistive element in the same direction as the first magnetic field. In this case, the first current sensor is configured to satisfy the following conditional expressions (5) and (6), and the second current sensor is configured to satisfy the following conditional expressions (7) and (8).

$$0.4\ \mu m \leq D2 \leq 1.0\ \mu m \tag{5}$$

$$0.4\ \mu m^2 \leq S2 \leq 3.0\ \mu m^2 \tag{6}$$

$$0.2\ \mu m \leq D2 \leq 0.4\ \mu m \tag{7}$$

$$0.4\ \mu m^2 \leq S2 \leq 2.5\ \mu m^2 \tag{8}$$

where D2 is a distance between a second extended portion and a first magnetoresistive element; and S2 is an area of a cross section orthogonal to a first direction in the second extended portion.

In particular, the second conductor is preferably a second thin film coil which winds in a third layer while including a plurality of turn portions as a second extended portion extending in a first direction in correspondence with the element patterns of the first magnetoresistive element, and which generates and applies a second magnetic field on each of the element patterns of the first magnetoresistive element under the supply of a current.

The first current sensor satisfying the conditional expressions (5) and (6), and the second current sensor satisfying the conditional expressions (7) and (8) enable a composite magnetic field of the first and second magnetic fields to be applied on the first magnetoresistive element, so that the absolute value of the resistance value in the first magnetoresistive element can be further increased, resulting in further improved measuring accuracy of a current.

In another alternative, the first and second current sensors may further include, in addition to a first magnetoresistive element and a first conductor, (i) a third conductor disposed in a first layer, the third conductor having a third extended portion extending in a first direction in an area other than where the first conductor is formed and being supplied with a current; and (ii) a second magnetoresistive element disposed in the second layer in an area corresponding to the third extended portion and commonly connected to the first magnetoresistive element, and the resistance value of the second magnetoresistive element varying according to a third magnetic field generated by a current flowing through the third extended portion. In this case, the first current sensor satisfies the following conditional expressions (11) and (12), and the second current sensor satisfies the following conditional expressions (9) and (10).

$$0.4\ \mu m \leq D3 \leq 1.0\ \mu m \tag{11}$$

$$0.4\ \mu m^2 \leq S3 \leq 3.0\ \mu m^2 \tag{12}$$

$$0.2\ \mu m \leq D3 \leq 0.4\ \mu m \tag{9}$$

$$0.4\ \mu m^2 \leq S3 \leq 2.5\ \mu m^2 \tag{10}$$

where D3 is a distance between a third extended portion and a second magnetoresistive element; and S3 is an area of a cross section orthogonal to a first direction in the third extended portion.

The presence of the first and second magnetoresistive elements permits greater accurate measurements of a current. With such a configuration that the resistance value of the second magnetoresistive element varies according to the third magnetic field in the direction opposite to resistance value variations in the first magnetoresistive element which can be brought by the first current magnetic filed, a current can be measured with greater accuracy based on a difference in voltage drop which can be brought when the same constant current is allowed to flow through the first and second magnetoresistive elements.

It may be arranged to further include: (i) a second conductor disposed in a third layer located in a side opposite to a first layer with respective to a second layer, the second conductor having a second extended portion extending in the first direction in correspondence with the first magnetoresistive element and generating a second magnetic field through the current supplied, the second magnetic field then applied on the first magnetoresistive element in the same direction as the first magnetic field; and (ii) a fourth conductor disposed in the third layer located in an area other than where the second conductor is formed, the fourth conductor having a fourth extended portion extending in the first direction in correspondence with the second magnetoresistive element and generating a fourth magnetic field through the current supplied, the fourth magnetic field then applied on the second magnetoresistive element in the same direction as the third magnetic field. In this case, the first current sensor satisfies the following conditional expressions (17) to (20), and the second current sensor satisfies the following conditional expressions (13) to (16).

$$0.44\ \mu m \leq D2 \leq 1.0\ \mu m \tag{17}$$

$$0.4\ \mu m \leq D4 \leq 1.0\ \mu m \tag{18}$$

$$0.4\ \mu m^2 \leq S2 \leq 3.0\ \mu m^2 \tag{19}$$

$$0.4\ \mu m^2 \leq S4 \leq 3.0\ \mu m^2 \tag{20}$$

$$0.2\ \mu m \leq D2 \leq 0.4\ \mu m \tag{13}$$

$$0.2\ \mu m \leq D4 \leq 0.4\ \mu m \tag{14}$$

$$0.4\ \mu m^2 \leq S2 \leq 2.5\ \mu m^2 \tag{15}$$

$$0.4\ \mu m^2 \leq S4 \leq 2.5\ \mu m^2 \tag{16}$$

where D2 and S2 are as described above; D4 is a distance between a fourth extended portion and a second magnetoresistive element; and S4 is an area of a cross section orthogonal to a first direction in the fourth extended portion.

With such a configuration that the first magnetoresistive element detects a composite magnetic field of the first and second magnetic fields, and the second magnetoresistive element detects a composite magnetic field of the third and fourth magnetic fields, the presence of the first and second magnetoresistive elements permits much more accurate measurements of a current flowing through the first to fourth conductors, while maintaining a compact configuration.

Preferably, it is configured such that the direction of a resistance value variation of the second magnetoresistive element brought through the third and fourth magnetic fields is opposite to resistance value variations in the first magnetoresistive element which can be generated by the first and second magnetic fields.

Other and further objects, features and advantages of the invention will appear more fully from the following description.

DETAILED DESCRIPTION OF THE PREFERRED EMBODIMENTS

Embodiments of the invention will be described in detail hereinbelow with reference to the drawings.

First Embodiment

Figure 1:
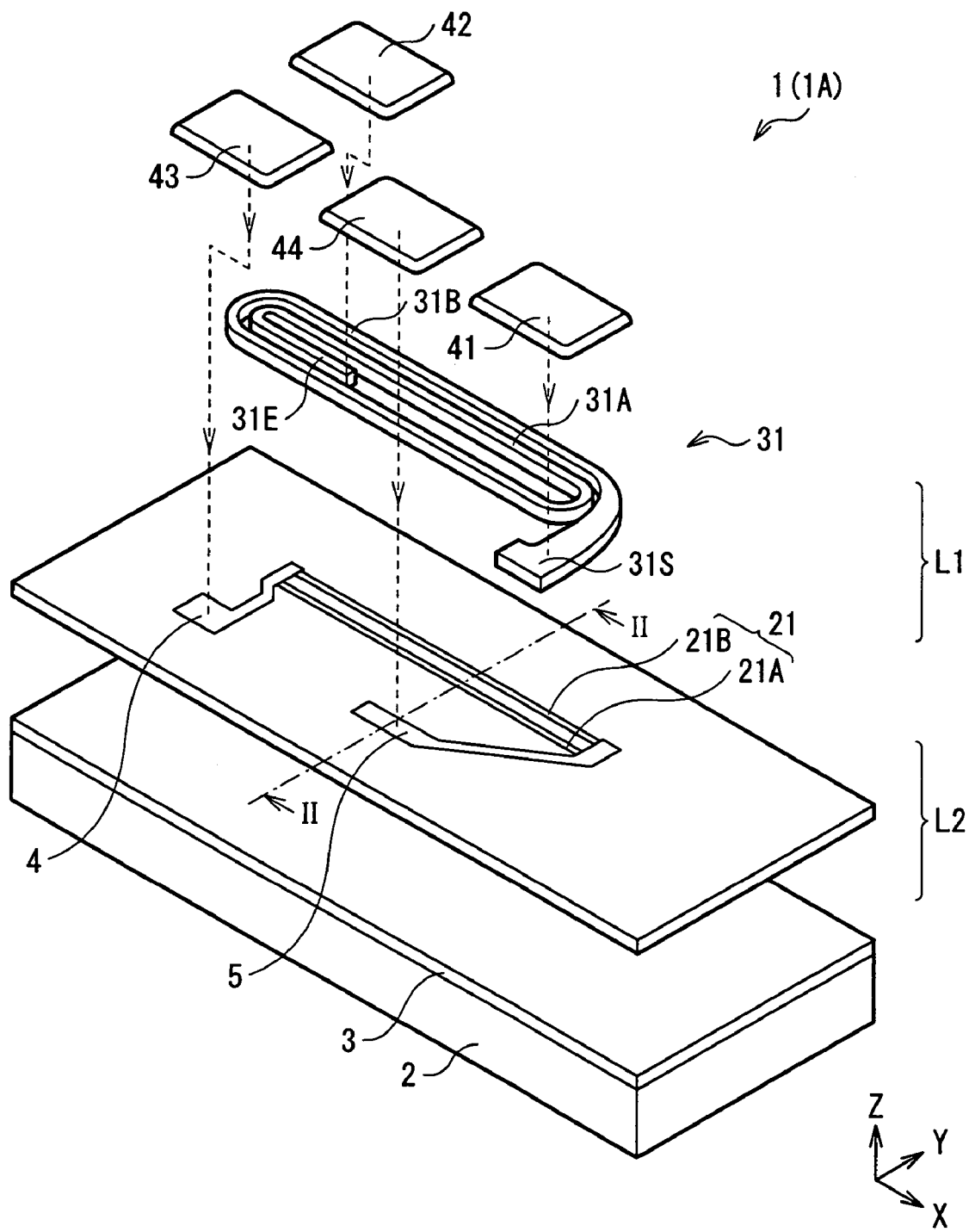
FIG. 1 is a perspective view showing the configuration of a current sensor according to a first embodiment of the invention.
Figure 2:
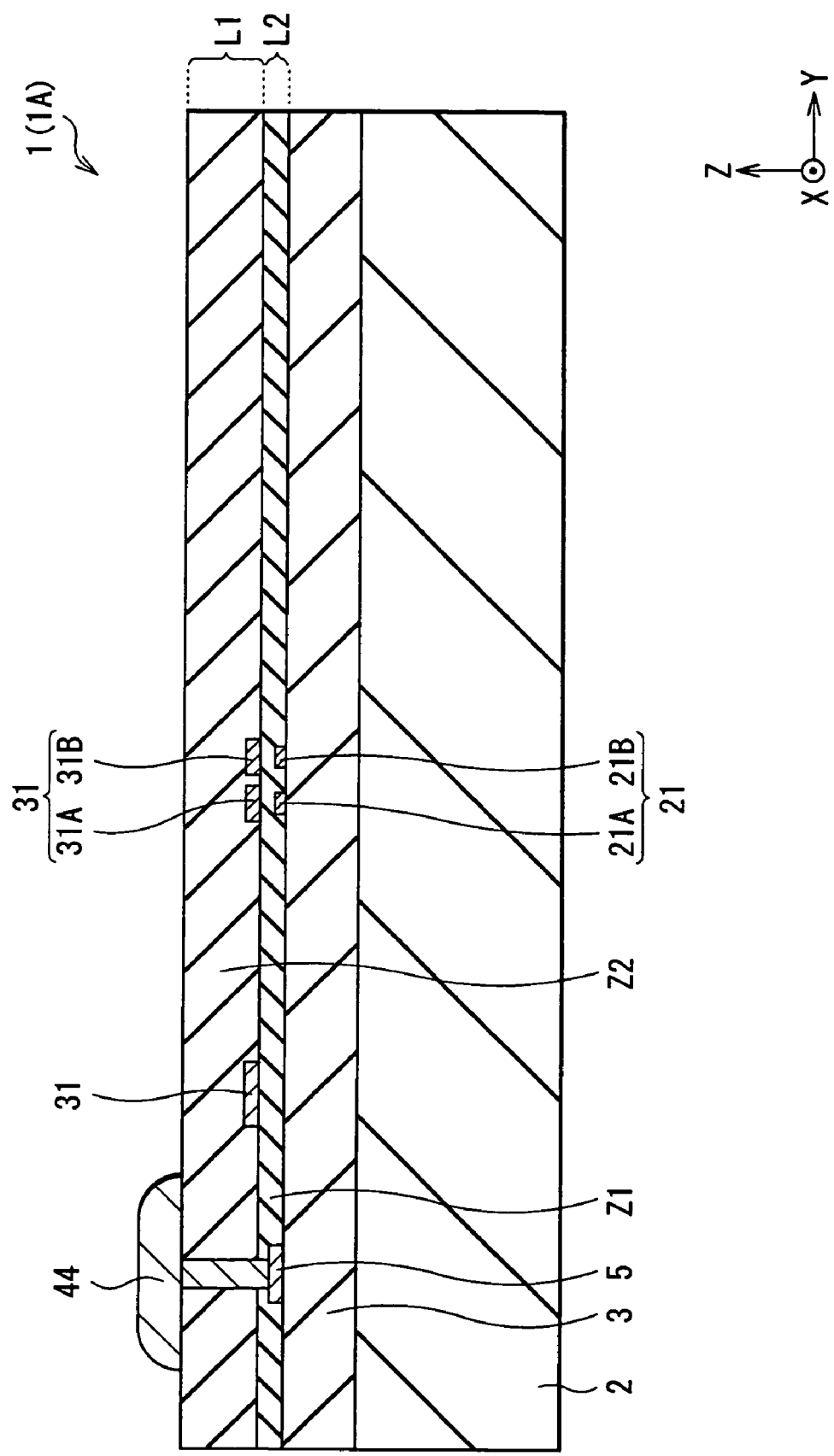
FIG. 2 is a sectional view taken along the line II-II of the current sensor shown in FIG. 1.

Reference to FIGS. 1 and 2, the configuration of a current sensor as a first embodiment of the invention will be described. FIG. 1 is a schematic view illustrating a perspective configuration of a current sensor 1 according to the embodiment. FIG. 2 shows a cross-sectional configuration taken along line II-II in the current sensor 1 of FIG. 1, looking in the direction of the appended arrows (−X-axis direction). The current sensor 1 is mounted on, for example, communication equipment, and used to accurately detect and measure a current of a control signal. In particular, current in the range of 10 mA to 50 mA is detected here. To distinguish the current sensor of the first embodiment from that in embodiments to be described later, the current sensor in the first embodiment is hereinafter referred to as a current sensor 1A.

The current sensor 1A includes a first thin film coil 31 as a first conductor disposed in a first layer L1, and a first magnetoresistive element 21 disposed in a second layer L2 (hereinafter referred to simply as a thin film coil 31). The first magnetoresistive element 21 has two element patterns 21A and 21B, extending in a first direction (an X-axis direction). The thin film coil 31 is configured so as to wind while including turn portions 31A and 31B as a first extended portion extending in the X-axis direction in correspondence to the element patterns 21A and 21B, respectively. Specifically, as shown in FIG. 2, the current sensor 1A has a structure in which the second layer L2 including the first magnetoresistive element 21, and the first layer L1 including the thin film coil 31 are stacked in the order listed via an underlayer 3 made of aluminum oxide ($Al_2O_3$) or the like on a substrate 2 made of silicon (Si) or the like. In the cross section of FIG. 2, the first magnetoresistive element 21 and the thin film coil 31 are covered with insulating films Z1 and Z2 made of $Al_2O_3$ or the like, respectively, and they are electrically isolated from each other. Moreover, a plurality of electrode films 41 to 44 are provided over the insulating film Z2, as shown in FIG. 1.

The thin film coil 31 is a thin film pattern made of high conductivity metal material such as copper (Cu), to which a current Im, for example, a control signal current is supplied. One end 31S of the thin film coil 31 is connected via a contact hole (not shown) to an electrode film 41, and the other end 31E is connected via a contact hole (not shown) to an electrode film 42 (see FIG. 1). The current sensor 1A is set such that a current Im flows from the end 31S to the end 31E.

The element patterns 21A and 21B detect a first magnetic field Hm1 (hereinafter referred to simply as a magnetic field Hm1) which can be generated by a current Im and are provided, in the stacking direction, in areas corresponding to the turn portions 31A and 31B of the thin film coil 31, respectively. The element patterns 21A and 21B are disposed such that they extend in an X-axis direction and are adjacent each other in a Y-axis direction (a second direction) orthogonal to the X-axis direction, and are connected in parallel to each other by electrode patterns 4 and 5. The electrode pattern 4 is connected via a contact hole (not shown) to the electrode film 43, and the electrode pattern 5 is connected via a contact hole (not shown) to the electrode film 44. The element patterns 21A and 21B are formed in a thickness of, for example, 0.8 μm by using sputtering method or the like. When a read current is allowed to flow through the element patterns 21A and 21B, they undergo resistance value variations according to a magnetic field Hm1 which can be caused by a current Im flowing through the thin film coils 31A and 31B.

Figure 3:
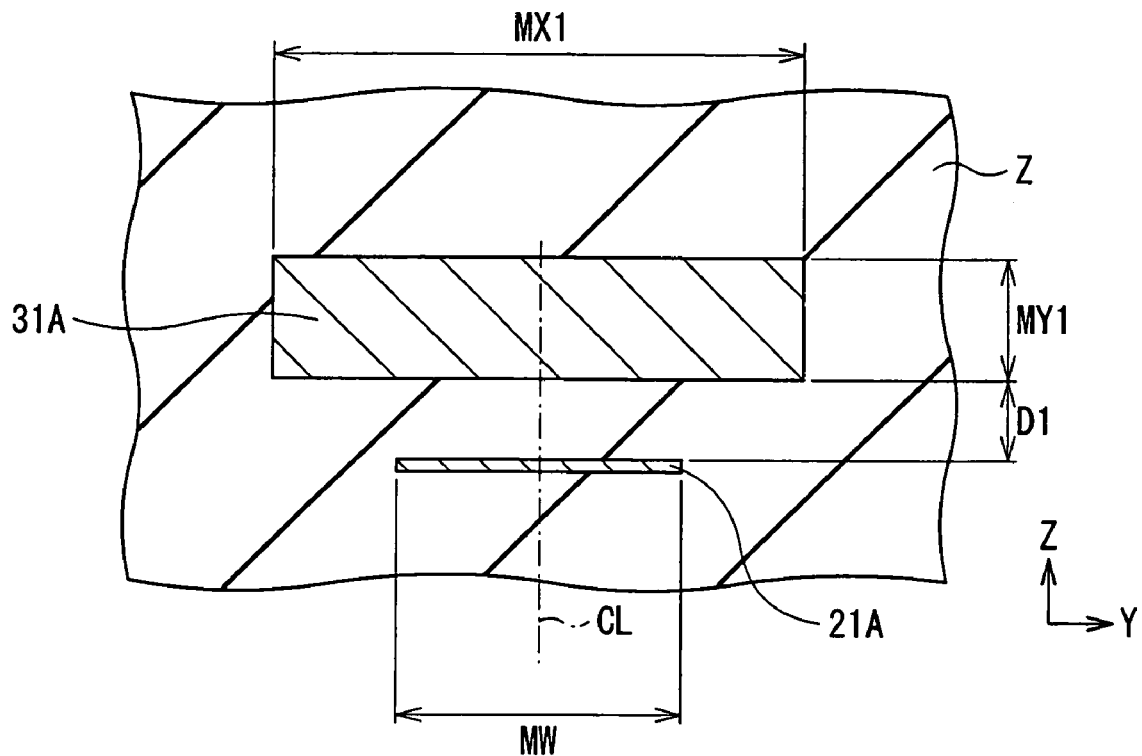
FIG. 3 is a sectional view showing in enlarged dimension a key part of the current sensor shown in FIG. 2.
Figure 4:
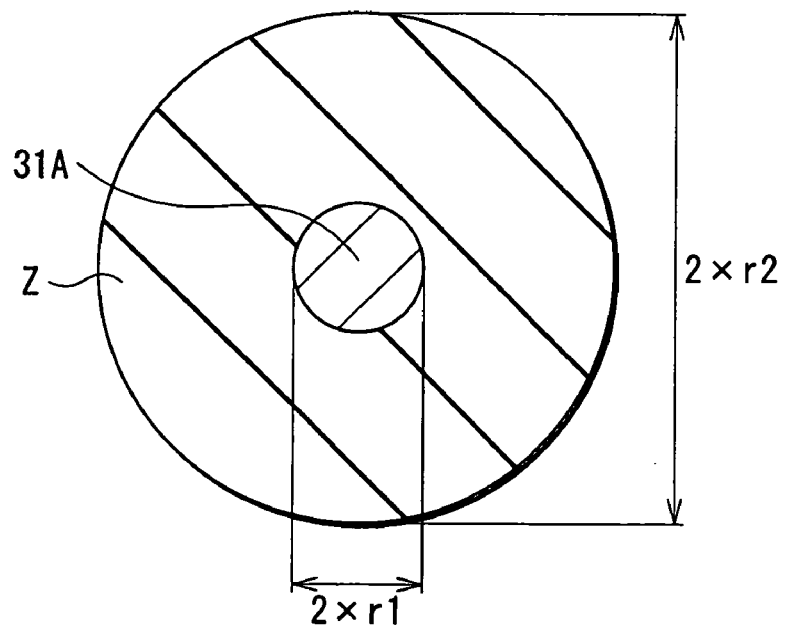
FIG. 4 is a schematic diagram for explaining the heat transfer amount from a turn portion to an element pattern in the current sensor shown in FIG. 1.

FIG. 3 is a sectional view showing in enlarged dimension an important part of FIG. 2. In FIG. 3, the turn portion 31A and the element pattern 21A are shown as representatives. The turn portion 31A and the element pattern 21A are arranged such that their respective center positions in the Y-axis direction match with each other (namely, both of the center positions exist on a virtual center line CL extending in the Z-axis direction), and they are disposed apart a distance D1 in the Z-axis direction. The distance D1 is in the range of 0.4 μm to 1.0 μm (Conditional expression 1). Specifically, if the insulating film Z1 separating the turn portion 31A from the element pattern 21A has a thickness of more than or equal to 0.4 μm, it can withstand momentary application of a voltage of 1000V, which is suitable to practical use. Since the smallest possible dimension is preferable in the interest of compactness, the distance D1 should be less than or equal to 1.0 μm.

The turn portion 31A is shaped as a rectangle defined by a width MX1 along a Y-axis and a thickness MY1 along a Z-axis in a YZ cross section (a cross section orthogonal to the X-axis direction), and has a cross-sectional area S1 (=MX1*MY1). Specifically, it is arranged such that the width MX1 is less than or equal to 3.0 μm, and the cross-sectional area S1 is in the range of 0.4 μm² to 3.0 μm² (Conditional expression 2). In consideration of accuracy during the process of formation, it is desirable to set the thickness MY1 at more than or equal to 0.2 μm and to be equal to or less than the width MX1.

When the cross-sectional area S1 is less than 0.4 μm², a current Im (=10 mA to 50 mA) flowing through the turn portion 31A might cause excess temperature rise (for example, exceeding 2.0° C.) in the element pattern 21A, resulting in poor accuracy of detection. A temperature change exceeding 2.0° C. in the element pattern 21A may cause output variations exceeding about 0.2%, which is undesirable because the reliability of the current sensor is lost. A calorific value P per unit length (1 m) of the turn portion 31A can be expressed by the following equation (A):

$$P = Im^2 * (\rho/S) \quad (A)$$

where Im is a current value; ρ is the specific resistance of copper; and SI is a cross-sectional area.

The current sensor 1A of this embodiment is aimed at detecting a control signal of communication equipment or the like, and therefore the magnitude of a current Im is 50 [mA] (=5×10⁻² [A]) in maximum. The specific resistance of copper is 1.92×10⁻⁸ [Ω*m]. Substitution of these into Equation (A) yields:

$$P = (25 \times 10^{-4}) * (1.92 \times 10^{-8})/S \quad (B)$$

$$= 48.0 \times 10^{-12} / S1 [W/m]$$

The element pattern 21A, which is disposed apart by the insulating film Z1 from the turn portion 31A that generates the calorific value P so obtained, will receive a heat transfer amount Q per unit length (1 m), which can be expressed by the following equation (C). For sake of simplicity, there is replaced by such an approximate model as shown in Fug. 4, in which the cross section of the turn portion 31A is a circle having a radius r1 (=(S1/π)⁰·⁵ [m], and the insulating film Z fills a range over a radius r2 [m] around this circle. In this case, the calorific value P generated from the turn portion 31A is transferred uniformly to the surroundings and passed through the insulating film Z having the radius r2, and then released from the surface of the insulating film Z to the exterior. At this time, the element pattern 21A in the vicinity of the turn portion 31A will receive part of the heat transfer amount Q, so that the temperature of the element pattern 21A is raised approximately as much as a surface temperature increment ΔT [° C.] of the turn portion 31A. This can be expressed as follows by letting λ be the heat conductivity of aluminum oxide (Al₂O₃) constituting the insulating film Z1.

$$Q = \lambda (2\pi/\ln(r2/r1)) * \Delta T \quad (C)$$

where the heat conductivity λ is 30 [W/m/° C.]. It is desirable that the temperature change ΔT is less than or equal to 2.0° C. Substitution of these into Equation (C) yields the following equation (D):

$$Q \leq 30 * (2\pi / \ln(r2/r1)) \times 2.0 \quad (D)$$

$$\leq 120\pi / \ln(r2/r1))$$

Here, Q=P, and the following equation (E) is obtained from Equations (B) and (D).

$$48.0 * 10^{-12} / S1 \leq 120\pi / \ln(r2/r1) \quad (E)$$

If the cross-sectional area "S1" is replaced with "π* (r1)²", the following equation (F) is obtained.

$$\ln(r2/r1)/(r1)^2 \leq 120\pi^2/48.0 * 10^{12} \quad (F)$$

$$\leq 2.5\pi^2 * 10^{12}$$

Considering the average thickness of the insulating film Z in the vicinity of the element pattern 21A, it is possible to regard this embodiment as the case where the insulating film Z covers the area over the radius r2 (=5+r1) πm. Hence, from Equation (F), the radius r1 is approximately more than or equal to 0.36 μm. It is therefore desirable that the cross-sectional area S is more than or equal to 0.4 μm².

Figure 5:
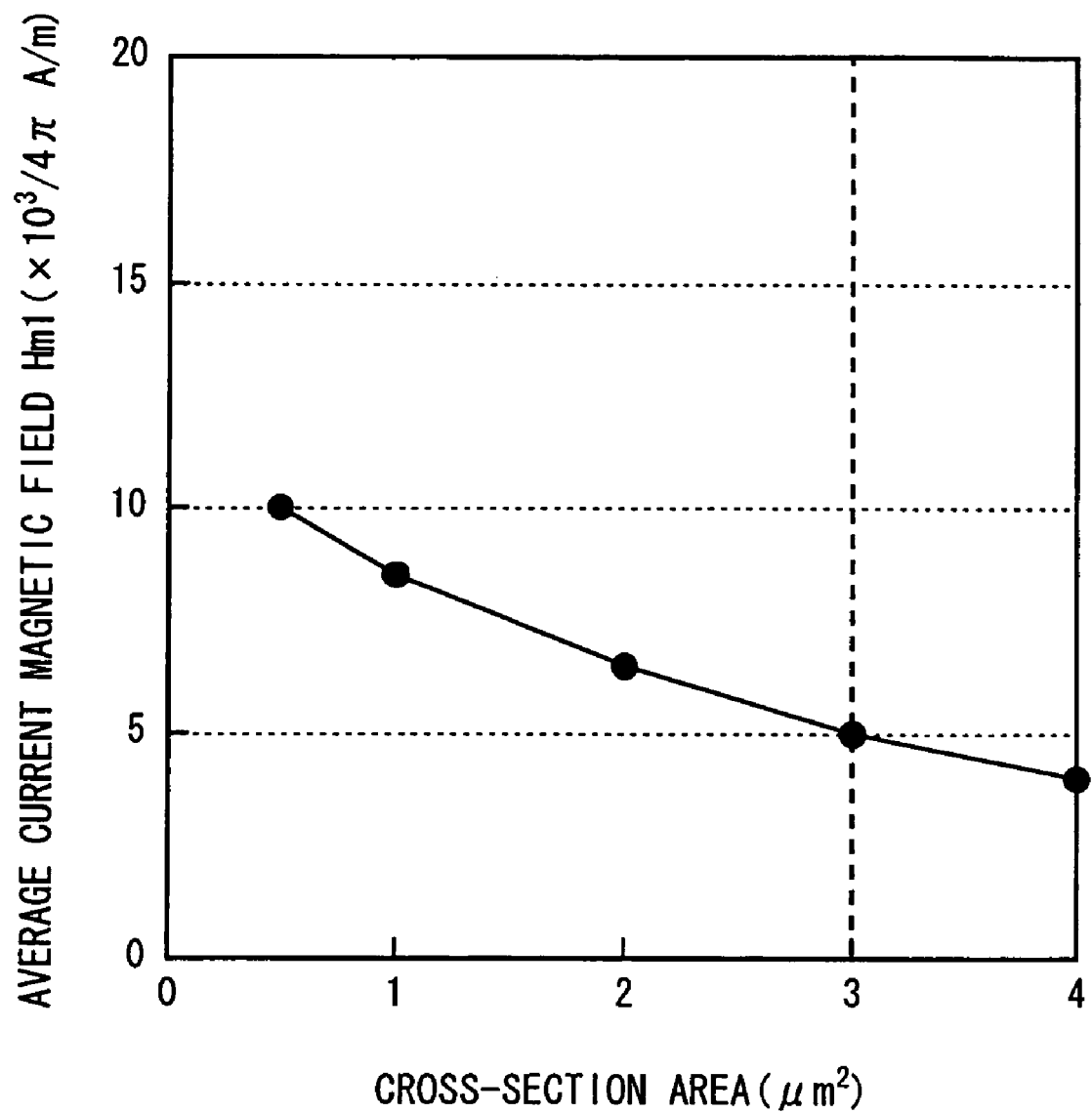
FIG. 5 is a plot of characteristics showing the relationship between a cross-sectional area of the turn portion shown in FIG. 4 and a generated magnetic field.

On the other hand, when the cross-sectional area S1 exceeds 3.0 μm², the strength of the magnetic field Hm1 is lowered, so that it is difficult for the element pattern 21A to perform excellent detecting operation. FIG. 5 plots the relationship between the cross-sectional area S1 and an average magnetic field Hm1, where a distance D1 is 1.0 μm, and a current Im is 10 mA. This indicates that the strength of the magnetic field Hm1 applied to the element pattern 21A is lowered as the cross-sectional area S1 is increased. Since the strength of substantially more than or equal to 50 e (=5*10³/4π [A/m]) is necessary for the element pattern 21A to perform stable detecting operation, the cross-sectional area S1 is preferably less than or equal to 3.0 μm².

The turn portion 31A having the above cross-sectional area S1 is configured with, for example, a width MX in the range of 0.8 μm to 3.0 μm and a thickness MY in the range of 0.2 μm to 1.4 μm in the YZ cross section orthogonal to the X-axis direction. A width MW in the Y-axis direction of the element pattern 21A is preferably less than or equal to 2.0 μm, in order to provide the element pattern 21A with a magnetic field Hm1 being sufficiently uniform over the whole in the Y-axis direction. On the other hand, the lower limit of the width MW is preferably 0.5 μm in order to achieve uniform film formation in the Y-axis direction. Although FIG. 3 shows the configuration (dimension and arrangement) of only the turn portion 31A and the element pattern 21A, the same is true for the turn portion 31B and the element pattern 21B.

Figure 6:
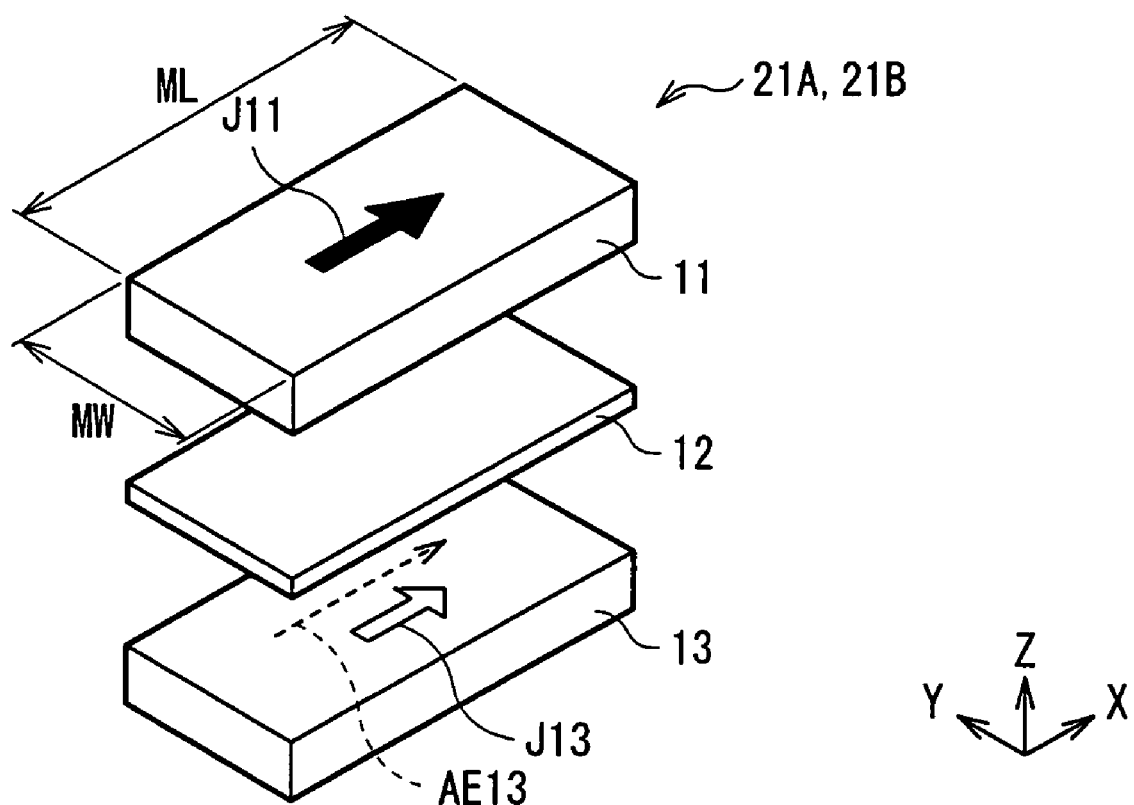
FIG. 6 is an exploded perspective view showing the configuration of a magnetoresistive element that forms a key part of the current sensor shown in FIG. 1.

Reference to FIGS. 6 to 9, the configuration of the element patterns 21A and 21B will next be described in more detail. FIG. 6 is an exploded perspective view showing the configuration of the element patterns 21A and 21B. Provided the proportion of dimension is different from that of a real thing.

As shown in FIG. 6, the element patterns 21A and 21B have a spin valve structure in which a plurality of function films including magnetic layers are stacked. Each of the element patterns 21A and 21B includes a pinned layer 11 having a magnetization direction J11 pinned in the +X direction, a free layer 13 whose magnetization direction J13 varies according to external magnetic fields H such as the magnetic field Hm1, and an intermediate layer 12 that is sandwiched between the pinned layer 11 and the free layer 13 and does not show any specific magnetization direction. The free layer 13 is made of a soft magnetic material such as nickel iron alloy (NiFe). The intermediate layer 12 is made of copper (Cu), the top face of which is in contact with the pinned layer 11 and the under face is in contact with the free layer 13. The intermediate layer 12 can be made of, instead of copper, nonmagnetic metal having high conductivity such as gold (Au). The top face of the pinned layer 11 (the surface on the side opposite to the intermediate layer 12) and the under face of the free layer 13 (the surface on the side opposite to the intermediate layer 12) are respectively protected by a protection film (not shown). Between the pinned layer 11 and the free layer 13, exchange bias magnetic fields Hin in the magnetization direction J11 (hereinafter referred to simply as "exchange bias magnetic fields Hin") are generated and interact with each other via the intermediate layer 12. The strength of the exchange bias magnetic field Hin varies as the spin direction of the free layer 13 rotates according to the interval between the pinned layer 11 and the free layer 13 (that is, the thickness of the intermediate layer 12). Although FIG. 6 shows an example of the configuration where the free layer 13, the intermediate layer 12, and the pinned layer 11 are stacked in bottom-to-top order, the invention is not limited to this configuration. These layers may be stacked in the reverse order.

The element patterns 21A and 21B are configured such that a length ML in the X-axis direction (longitudinal dimension) is in the range of 10 times to 200 times a width MW in the Y-axis direction (width dimension). Specifically, the length ML is preferably in the range of, for example, in the range of 20 μm to 100 μm. Thus, the element patterns 21A and 21B are shaped as a stripe having a large length ML with respect to the width MW, thereby exhibiting shape magnetic anisotropy along the Y-axis direction. Such a strip-shaped configuration improves the linearity of variations in resistance change rate with respect to variations in the external magnetic field H applied in +Y or −Y direction. If the length ML (longitudinal dimension) is less than 10 times the width MW in the Y-axis direction (width dimension), ample shape magnetic anisotropy is unobtainable. In contrast, any dimensional ratio exceeding 100 times is undesirable because no improvement of shape magnetic anisotropy can be expected and noise due to an increased resistance value may be generated.

Figure 7:
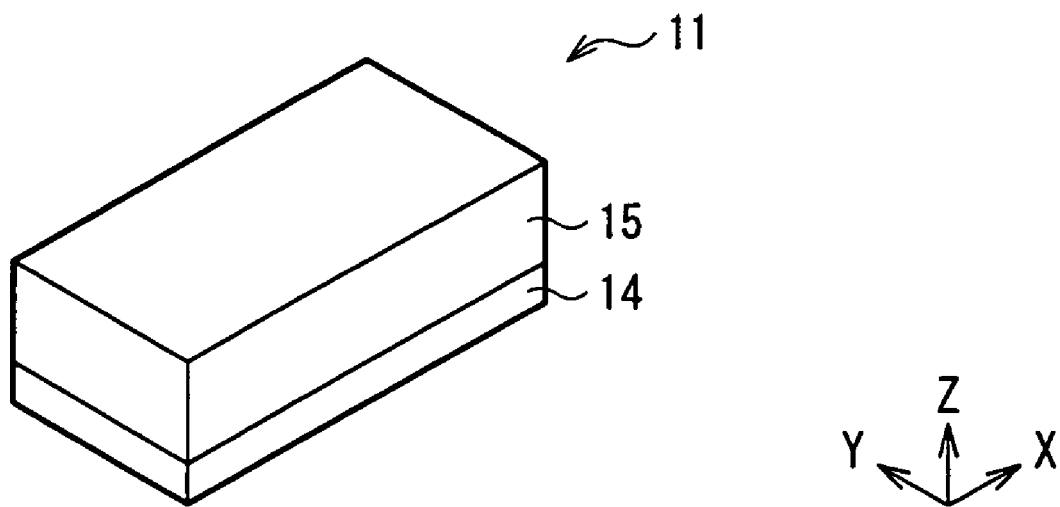
FIG. 7 is a perspective view showing the configuration of a part of the magnetoresistive element shown in FIG. 6.

FIG. 7 shows a detailed configuration of the pinned layer 11. The pinned layer 11 has such a structure that a magnetization pinned film 14 and an antiferromagnetic film 15 are stacked in order from the side of the intermediate layer 12. The magnetization pinned film 14 is made of a ferromagnetic material such as cobalt (Co) or cobalt iron alloy (CoFe). The magnetization direction of the magnetization pinned film 14 is the magnetization direction J11 of the pinned layer 11 as a whole. The antiferromagnetic film 15 is made of an antiferromagnetic material such as platinum manganese alloy (PtMn) or iridium manganese alloy (IrMn). The antiferromagnetic film 15 is in the state where the spin magnetic moment in the +X direction and that in the opposite direction (−X direction) completely cancel out each other, and it functions to pin the magnetization direction J11 of the magnetization pinned film 14.

In the element patterns 21A and 21B so configured, upon the application of the magnetic field Hm1, the magnetization direction J13 of the free layer 13 rotates thereby to change a relative angle between the magnetization directions J13 and J11. The relative angle is determined according to the magnitude and direction of the magnetic field Hm1.

Figure 8:
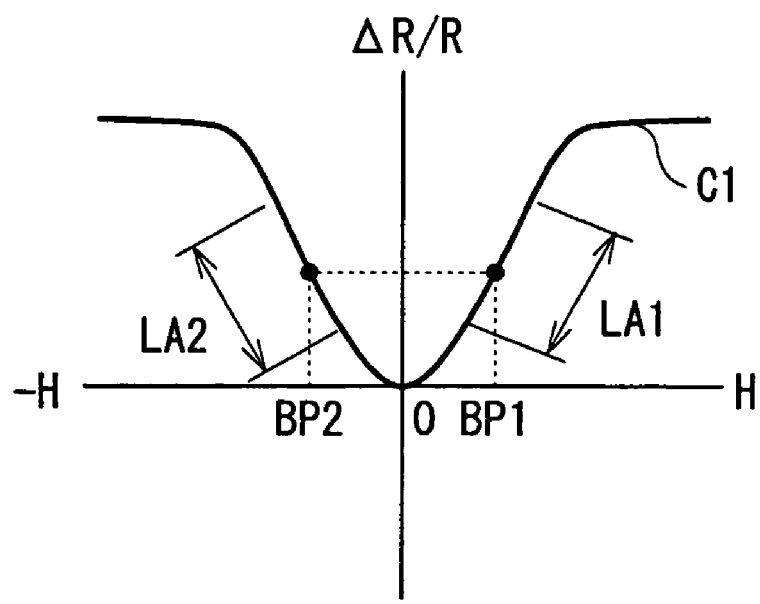
FIG. 8 is a plot of characteristics showing magnetic field dependency of a resistance change rate in the magnetoresistive element shown in FIG. 6.

FIG. 6 shows an unloaded state in which the magnetic field Hm1 is zero (Hm=0) and other magnetic fields (such as a bias magnetic field) are not applied (namely, the state in which the external magnetic field H is zero). An easy magnetization axis direction AE13 of the free layer 13 is parallel to the magnetization direction J11 of the pinned layer 11. Thereby, in this state, all of the easy magnetization axis direction AE13 and the magnetization directions J11 and J13 are parallel to each other along the +X direction, so that the spin directions of magnetic domains in the free layer 13 are aligned in almost the same direction. In the case where the external magnetic field H is applied to the element patterns 21A and 21B in the direction orthogonal to the magnetization direction J11 (+Y direction or −Y direction), such characteristics as shown in FIG. 8 are obtainable. FIG. 8 shows the relationship between the external magnetic field H and the resistance change rate ΔR/R, on the assumption that the external magnetic field H in the +Y direction is positive. The relationship between the two becomes local minimum (ΔR/R=0) when the external magnetic field H is zero. This can be expressed by a curve C1 which remains practically hysteresis-free. In this case, 1/f noise caused by hysteresis is minimized, permitting high-sensitive and stable sensing.

Figure 9:
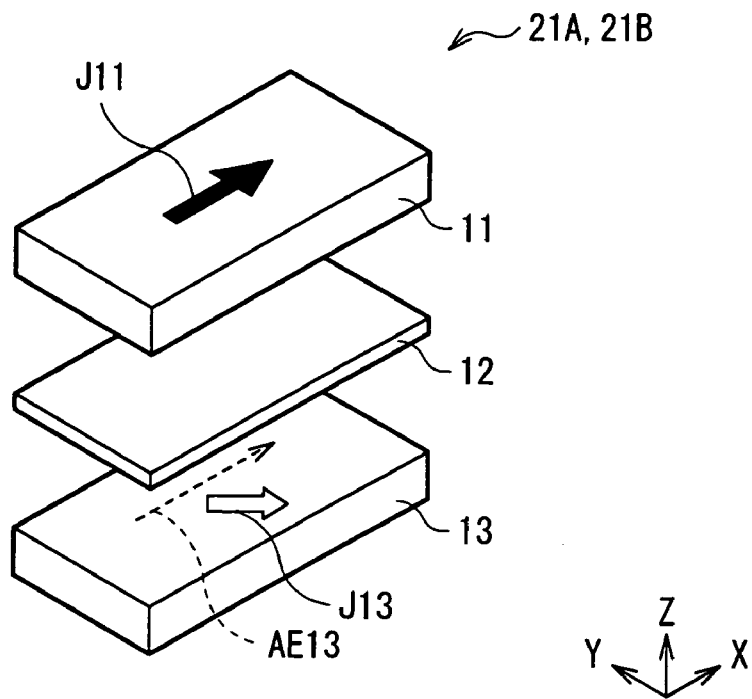
FIG. 9 is another exploded perspective view showing the configuration of the magnetoresistive element that forms a key part of the current sensor shown in FIG. 1.

As apparent from FIG. 8, however, a linear change is unobtainable in the neighborhood of zero in the external magnetic field H (H=0). Therefore, in the practical measuring of a magnetic field Hm1, by applying a bias magnetic field arising from a permanent magnet (not shown) in a direction orthogonal to the magnetization direction J11, the magnetization direction J13 is rotated and slightly tilted so as to include a component in the +Y direction or a component in the −Y direction, as shown in FIG. 9 (exemplifying the case of being tilted in the −Y direction). This enables variations in the magnetic field Hm1 to be detected with high accuracy in linear areas LA1 and LA2 around bias points BP1 and BP2 shown in FIG. 8, respectively.

Figure 10:
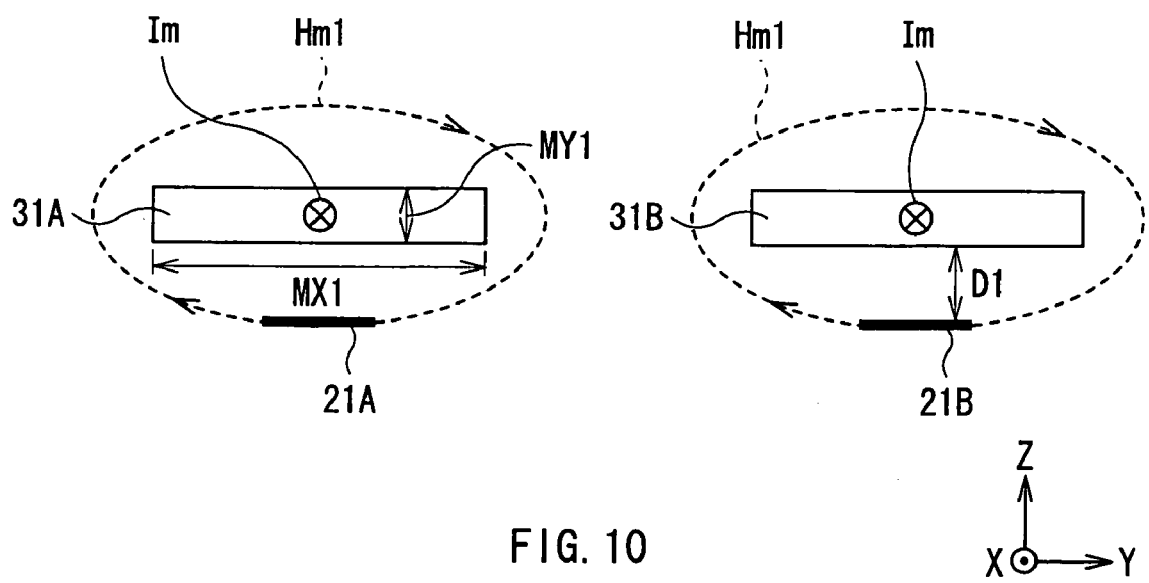
FIG. 10 is another sectional view showing in enlarged dimension a key part of FIG. 2.

In sensing with the current sensor 1A having the above configuration, first, a sense current is allowed to flow through the element patterns 21A, 21B via the electrode films 43, 44. It is arranged such that a current Im is supplied via the electrode films 41 and 42 to the thin film coil 31 such that the element patterns 21A and 21B can detect a magnetic field Hm1 generated from the turn portions 31A and 31B, respectively. For example, if a current Im is allowed to flow from the end 31S of the thin film coil 31 to the end 31E, as shown in FIG. 10, the current Im will flow in the −X direction (from near side to far side as seen in FIG. 10). As a result, the magnetic field Hm1 is generated which winds (in a clockwise as seen in FIG. 10) the surroundings of the turn portions 31A and 31B, respectively, according to corkscrew rule. Hence, the magnetic field Hm1 toward the −Y direction is applied on each of the element patterns 21A and 21B, so that their respective resistance values will vary. At this time, the dimension of the current Im can be estimated by detecting a variation in voltage drop (a variation in resistance value) between the electrode patterns 4 and 5.

Thus, the current sensor 1A of this embodiment is configured to have: (i) the first magnetoresistive element 21 extending in the X-axis direction in the second layer L2 and including the element patterns 21A and 21B that are disposed adjacent each other in the Y-axis direction orthogonal to the X-axis direction and connected in parallel to each other; and (ii) the thin film coil 31 which winds in the first layer L1 while including the turn portions 31A and 31B that extend in the X-axis direction in correspondence with the element patterns 21A and 21B, respectively, and which applies the magnetic field Hm1 on each of the element patterns 21A and 21B under the supply of a current Im. With this configuration, the first magnetoresistive element 21 and the thin film coil 31 can be brought into closer than the case where they are disposed adjacent each other in an in-plane direction, for example, they are disposed within the same layer.

Moreover, by virtue of the turn portions 31A and 31B of the thin film coil 31, the magnetic field Hm1 can be applied separately on the element patterns 21A and 21B of the magnetoresistive element 21 which correspond to the turn portions 31A and 31B, respectively. Therefore, from the viewpoint of the heat generated from the coil and the current efficiency of the coil magnetic field strength, the location and cross-sectional dimension in the cross section orthogonal to the first direction can be optimized easily. The magnetic field Hm1 can be applied on the element patterns 21A and 21B with higher efficiency compared to the case of applying on each element pattern a magnetic field formed only by a current flowing through a single conductor (a turn portion). This permits high-sensitivity detection of the current Im.

In particular, the parallel connection of the element patterns 21A and 21B enables the entire resistance value in the first magnetoresistive element 21 to be held relatively low without reducing resistance change rate, thereby reducing the calorific value during use. Furthermore, the influence due to noise from the exterior (undesired magnetic field) can be reduced to improve the S/N ratio. For the above reasons, the current sensor 1A that is compact permits high-accuracy measurement of a current Im flowing through the thin film coil 31.

Additionally, setting the distance D1 in thickness direction (Z-axis direction) between the turn portions 31A, 31B and the element patterns 21A, 21B in the range of 0.4 µm to 1.0 µm, and the cross-sectional area S1 of the turn portion 31A in the range of 0.4 µm$^2$ to 3.0 µm$^2$ enable the magnetic field Hm1 to be detected efficiently with reduction of the influence of heat generated from the thin film coil 31. This permits high-accuracy measurement of a relatively weak current Im flowing through the thin film coil 31 which is in the range of 10 mA to 50 mA.

Modification 1

Although the first embodiment describes the case of measuring a current Im which is in the range of 10 mA to 50 mA, it is possible to configure a current sensor so as to measure a weaker current Im, for example, in the range of 3 mA to 50 mA. In this case, the distance D1 as shown in the sectional view of FIG. 3 is in the range of 0.2 µm to 0.4 µm (Conditional expression 3). This is because the turn portion 31A and the element pattern 21A need to be closer in order to detect a magnetic field Hm1 formed by a weaker current Im as low as less than or equal to 10 mA. On the other hand, setting at more than or equal to 0.2 µm makes it possible to withstand an application of a surge voltage of 700 V. This is practically favorable.

The cross-sectional area S1 (=MX*MY1) in the turn portion 31A is in the range of 0.4 µm$^2$ to 2.5 µm$^2$ (Conditional expression 4). When the cross-sectional area S1 is less than 0.4 µm$^2$, a current Im flowing through the turn portion 31A causes an excessive temperature rise (for example, exceeding 2.0° C.) in the element pattern 21A, and the accuracy of detection might be deteriorated. On the other hand, when the cross-sectional area S1 is above 2.5 µm$^2$, the strength of the magnetic field Hm1 may be lowered, making it difficult for the element pattern 21A to perform excellent detecting operation.

Thus, the current sensor 1A as a modification, which is configured to satisfy Conditional expressions 3 and 4, permits efficient measurement of a magnetic field Hm1 with reduction of the influence of heat generated from the thin film coil 31. This permits high-accuracy measurement of a current Im flowing through the thin film coil 31, which is in the range of 3 mA to 50 mA.

Second Embodiment

Figure 11:
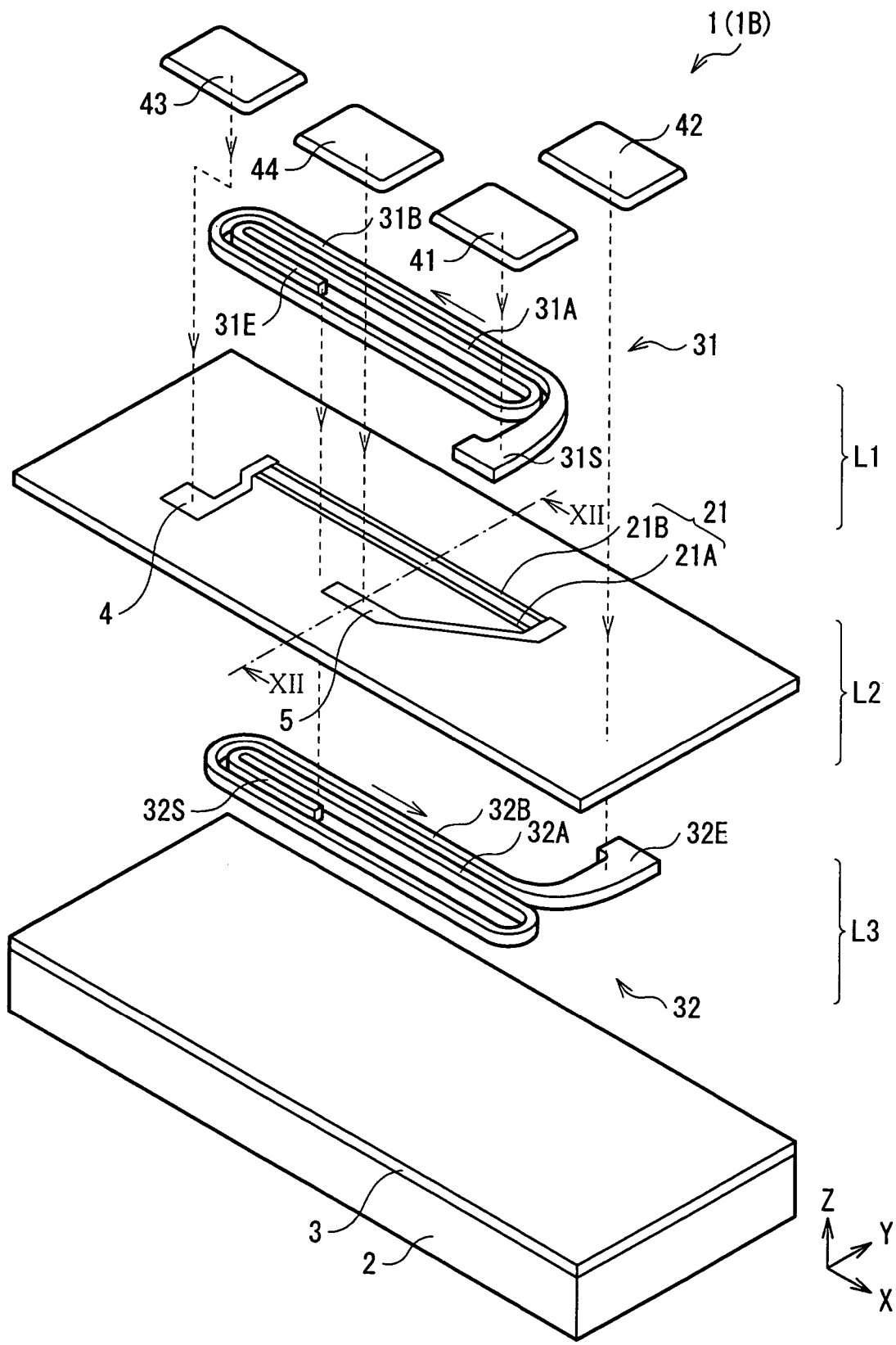
FIG. 11 is a perspective view showing the configuration of a current sensor according to a second embodiment of the invention.
Figure 12:
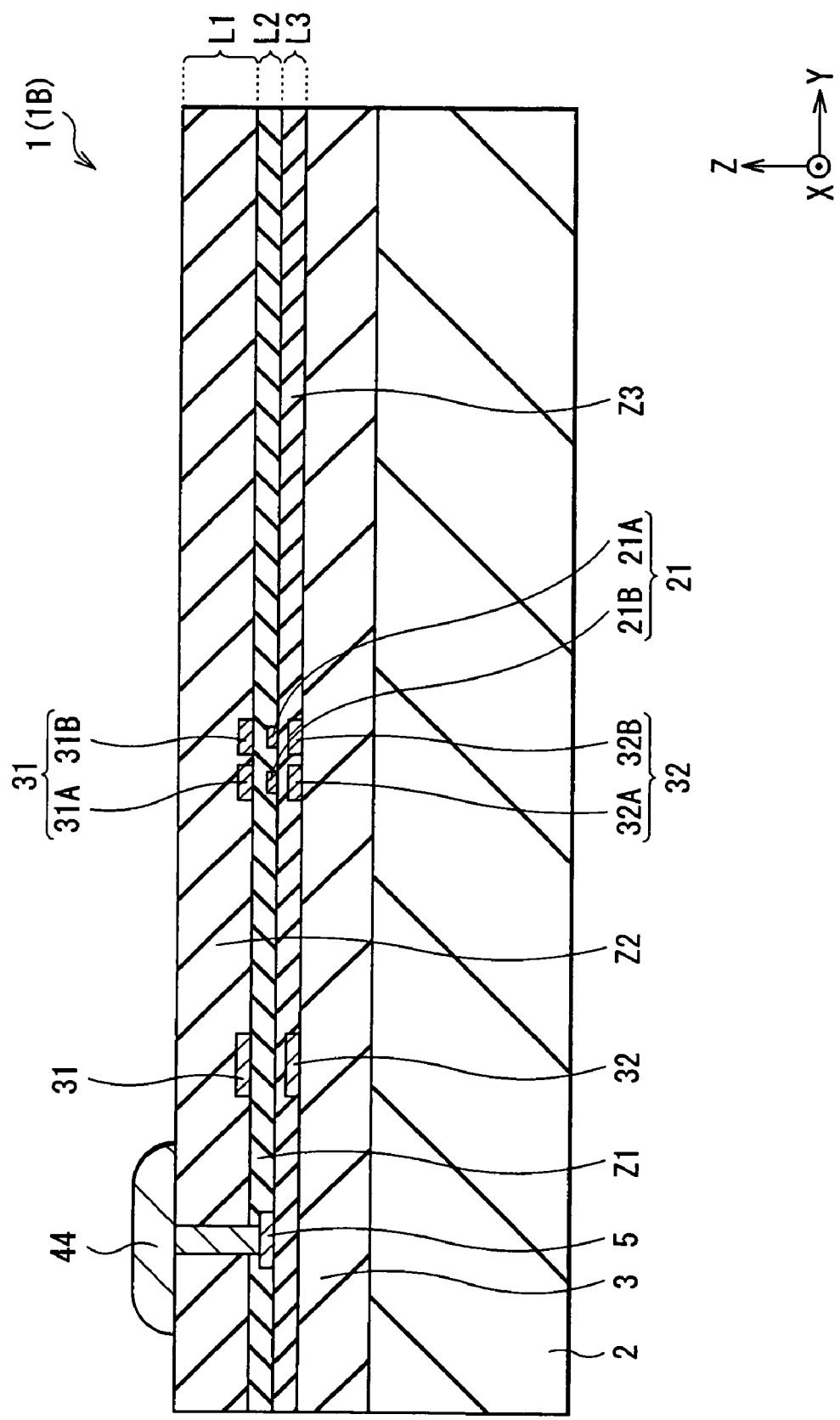
FIG. 12 is a sectional view taken along the line XII-XII of the current sensor shown in FIG. 11.
Figure 13:
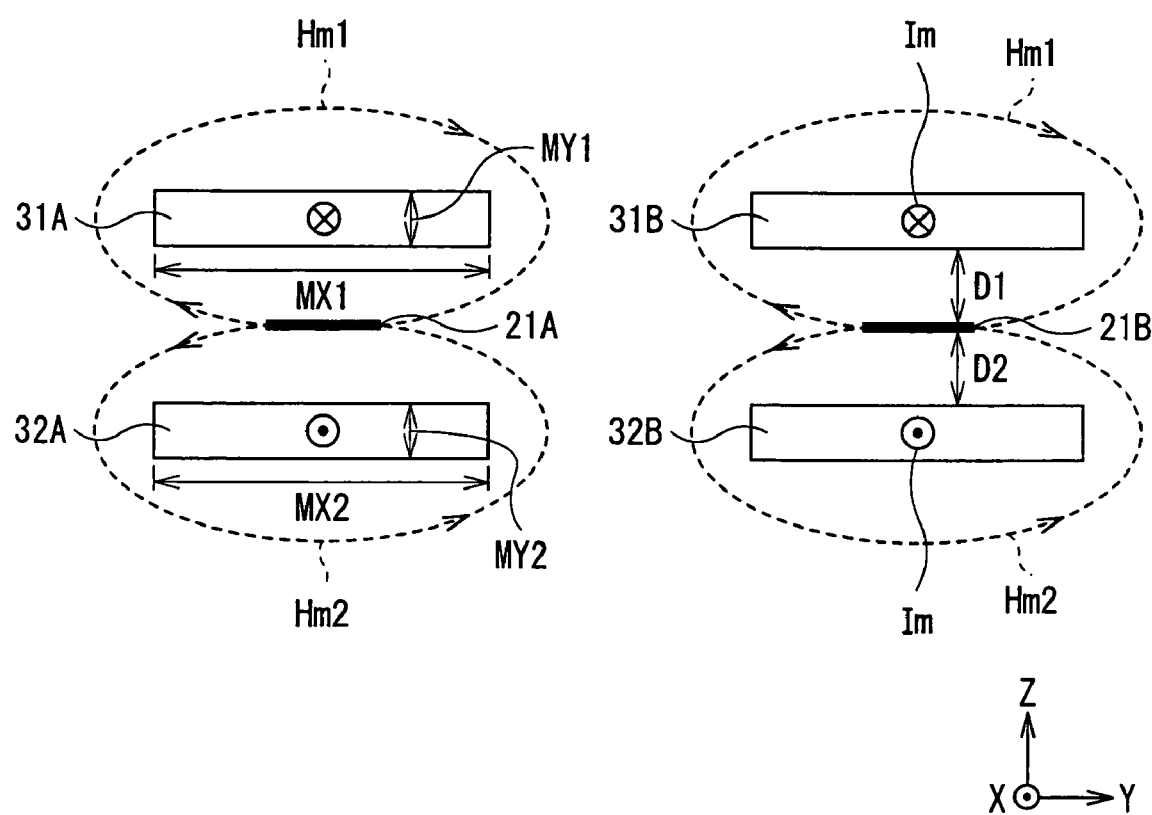
FIG. 13 is a sectional view showing in enlarged dimension a key part of FIG. 12.

Reference to FIGS. 11 to 13, a current sensor 1B as a second embodiment of the invention will be described below.

FIG. 11 is a perspective view showing a perspective configuration of the current sensor 1B. FIG. 12 shows a cross-sectional configuration in the direction indicated by the arrows (−X direction) along the line XII-XII of the current sensor 1B shown in FIG. 11. The current sensor 1B can be obtained by adding a second thin film coil 32 (hereinafter referred to simply as a thin film coil 32) as a second conductor, to the current sensor 1A of the above embodiment.

Specifically, with respect to a second layer L2, a third layer L3 is provided on the side opposite to a first layer L1 in the current sensor 1B, and the thin film coil 32 is formed so as to be buried in an insulating film Z3 in the third layer L3. In other words, as shown in FIG. 12, the current sensor 1B has such a structure that the third layer L3 including the thin film coil 32, the second layer L2 including a first magnetoresistive element 21, and the first layer L1 including a thin film coil 31 are stacked in the order listed, via an underlayer 3 made of Al$_2$O$_3$ or the like, on a substrate 2 made of silicon or the like. In the cross section of FIG. 12, the thin film coil 32, the first magnetoresistive element 21, and the thin film coil 31 are covered with the insulating films Z3, Z1, and Z2, respectively, which are made of Al$_2$O$_3$ or the like, and they are electrically isolated from each other.

Like the thin film coil 31, the thin film coil 32 is a thin film pattern made of a high conductive metal material such as copper. The thin film coil 32 is configured so as to wind while including turn portions 32A and 32B extending in the X-axis direction in correspondence with element patterns 21A and 21B of the first magnetoresistive element 21, and also apply a second magnetic field Hm2 (hereinafter referred to simply as a magnetic field Hm2), which is the same in direction as a magnetic field Hm1, on each of the element patterns 21A and 21B under the supply of a current Im. One end 31E of the thin film coil 31 is connected via a contact hole (not shown) to one end 32S of the thin film coil 32, and the other end 32E of the thin film coil 32 is connected via a contact hole (not shown) to an electrode film 42. Consequently, the thin film coils 31 and 32 configure a single conductor line in the circuit.

In the current sensor 1B so configured, single stream of current Im flowing through the thin film coils 31 and 32 causes the two magnetic fields Hm1 and Hm2 to act on the first magnetoresistive element 21, as shown in FIG. 13. FIG. 13 shows in enlarged dimension part of FIG. 12, and it is an explanatory diagram for explaining the actions of the magnetic fields Hm1 and Hm2 on the element patterns 21A and 21B, respectively. Here, the turn portions 31A, 31B and the element pattern 21A, 21B are disposed apart a distance D1 in the Z-axis direction, and the turn portions 32A, 32B and the element patterns 21A, 21B are disposed apart a distance D2 in the Z-axis direction. Each of the distances D1 and D2 is in the range of 0.4 µm to 1.0 µm (Conditional expressions 1 and 5). Each of the turn portions 31A and 31B has a rectangle cross section defined by a width MX1 and a thickness MY1, and has a cross-sectional area S1 (=MX1*MY1). Similarly, the turn portions 32A and 32B are shaped as a rectangle defined by a width MX2 along the Y-axis direction and a thickness MY2 along the Z-axis direction, and have a cross-sectional area S2 (=MX2*MY2). Specifically, it is arranged such that each of the widths MX1 and MX2 is less than or equal to 3.0

μm, and each of the cross-sectional areas S1 and S2 is in the range of 0.4 μm² to 3.0 μm² (Conditional expressions 2 and 6). In consideration of accuracy during the process of formation, it is desirable to set the thickness MY1, MY2 at more than or equal to 0.2 μm and to be equal to or less than the width MX1, MX2.

In sensing with the current sensor 1B, first, a sense current is allowed to flow through the electrode films 43 and 44 to the element patterns 21A and 21B. Then, a current Im is supplied via the electrode films 41 and 42 to the thin film coils 31 and 32 such that the element patterns 21A and 21B detect a magnetic field Hm1 generated from the turn portions 31A and 31B and a magnetic field Hm2 generated from the turn portions 32A and 32B, respectively. For example, when a current Im is allowed to flow from the end 31S of the thin film coil 31 to the end 31E, and subsequently from the end 32S of the thin film coil 32 to the end 32E, as shown in FIG. 13, the current Im will flow in the −X direction (from near side to far side as seen in FIG. 13) at the turn portions 31A and 31B. As a result, a magnetic field Hm1 is generated which winds (in a clockwise as seen in FIG. 13) the surroundings of the turn portions 31A and 31B, respectively, according to corkscrew rule. On the other hand, the current Im will flow in the +X direction (from far side to near side as seen in FIG. 13) at the turn portions 32A and 32B. As a result, a magnetic field Hm2 is generated which winds (in a counterclockwise as seen in FIG. 13) the surroundings of the turn portions 32A and 32B, respectively, according to corkscrew rule. Hence, a composite magnetic field of the magnetic fields Hm1 and Hm2 toward the −Y direction is supplied to the element patterns 21A and 21B, respectively. Therefore, strength of the magnetic field applied on the element patterns 21A and 21B can be increased, resulting in greater variations in resistance value than the case of applying only the magnetic field Hm1. Here, in the same manner as in the first embodiment, the magnitude of the current Im can be estimated by detecting a variation in voltage drop (a variation in resistance value) between the electrode patterns 4 and 5.

Thus, since the current sensor 1B of this embodiment includes the thin film coil 32 configured so as to apply the magnetic field Hm2, which is the same in direction as the magnetic field Hm1, on each of the element patterns 21A and 21B, a composite magnetic field of the magnetic fields Hm1 and Hm2 can be applied on the element patterns 21A and 21B. This further increases the absolute value of the variation in the resistance value at the first magnetoresistive element 21, permitting higher-accuracy measurement of a current Im.

Especially, like the first embodiment, each of the distance D1 between the turn portions 31A, 31B and the element patterns 21A, 21B, and the distance D2 between the turn portions 32A, 32B and the element patterns 21A, 21B is in the range of 0.4 μm to 1.0 μm. Also, each of the cross-sectional area S1 of the turn portions 31A and 31B, and the cross-sectional area S2 of the turn portions 32A and 32B is in the range of 0.4 μm² to 3.0 m². With this configuration, the composite magnetic field of the magnetic fields Hm1 and Hm2 can be detected efficiently with reduction of the influence of heat generated from the thin film coils 31 and 32. This permits high-accuracy measurement of a relatively weak current Im flowing through the thin film coils 31 and 32, which is from 10 μmA to 50 mA.

Modification 2

Although the above embodiment describes the case of measuring the current Im which is in the range of 10 mA to 50 mA, it is possible to configure a current sensor so as to measure a weaker current Im, for example, in the range of 3 mA to 50 mA. In this case, each of the distances D1 and D2 is in the range of 0.2 μm to 0.4 μm (Conditional expressions 3 and 7), and each of the cross-sectional areas S1 and S2 is in the range of 0.4 μm² to 2.5 μm² (Conditional expressions 4 and 8).

Thus, the current sensor 1B as a modification, which is configured to satisfy the conditional expressions 3, 4, 7, and 8, enables the composite magnetic field of the magnetic fields Hm1 and Hm2 to be detected efficiently with reduction of the influence of heat generated from the thin film coils 31 and 32. This permits high-accuracy measurement of a current Im flowing through the thin film coils 31 and 32, which is in the range of 3 mA to 50 mA.

Third Embodiment

Figure 14:
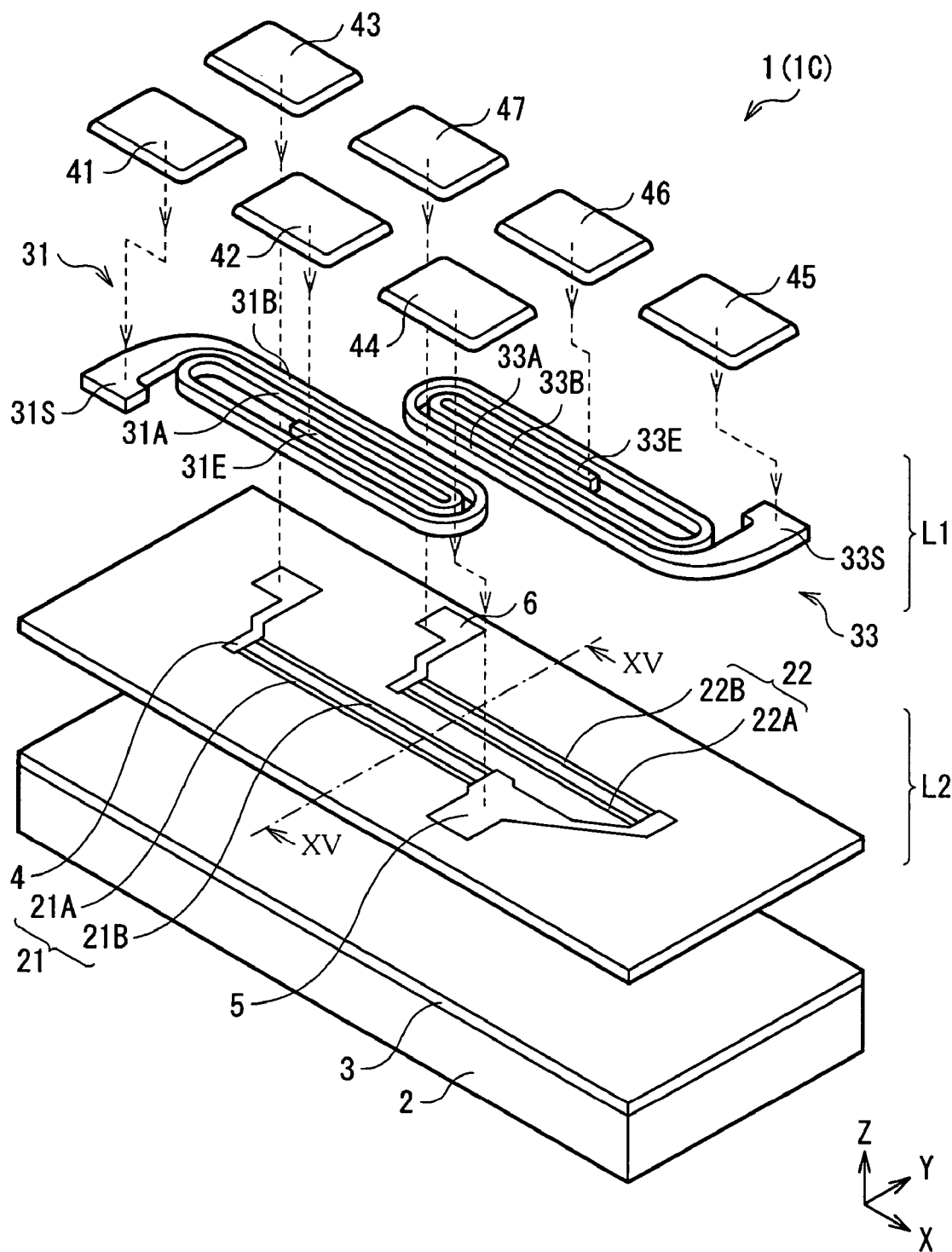
FIG. 14 is a perspective view showing the configuration of a current sensor according to a third embodiment of the invention.
Figure 15:
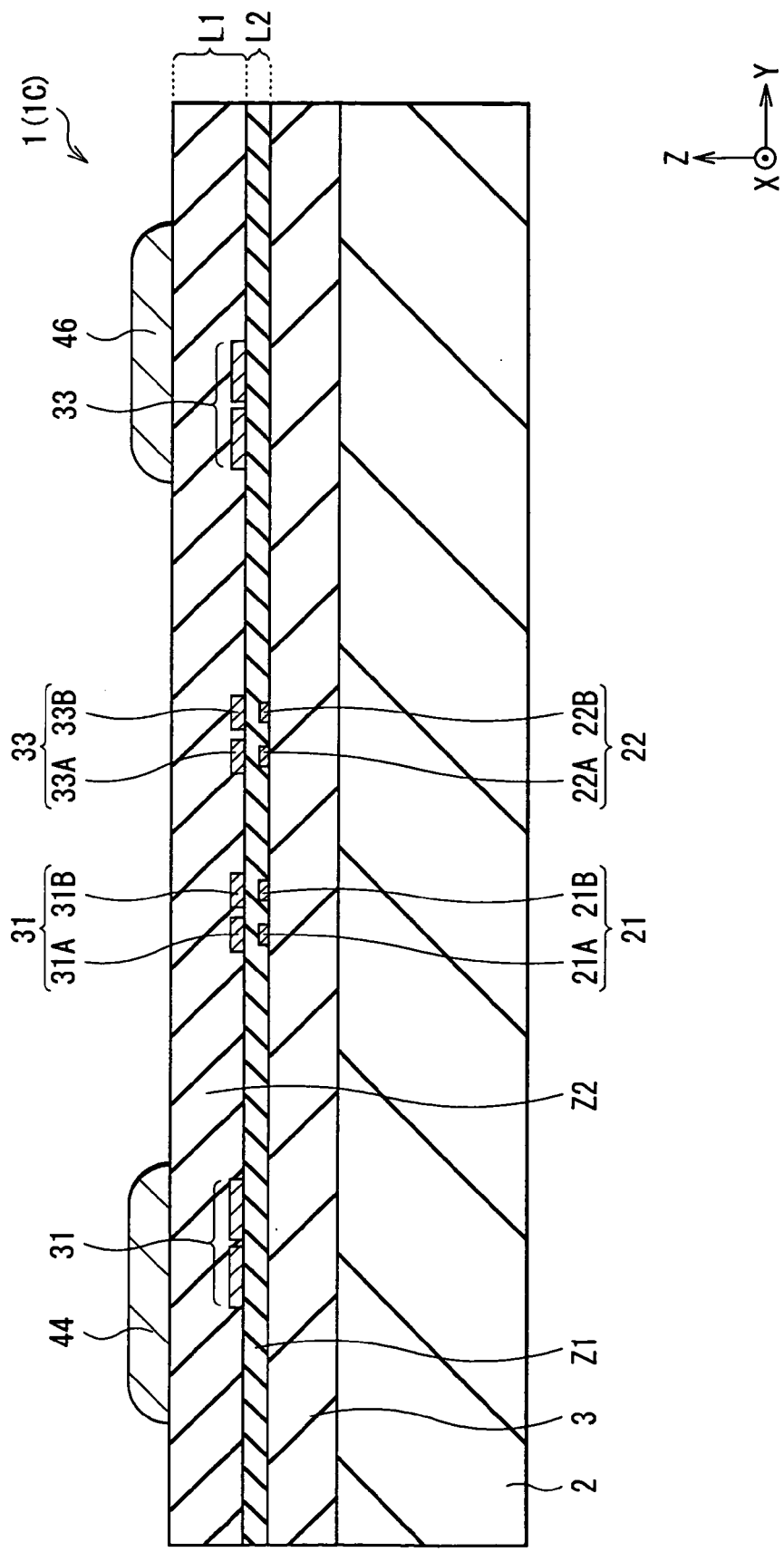
FIG. 15 is a sectional view taken along the line XV-XV of the current sensor shown in FIG. 14.

Reference to FIGS. 14 to 17, a current sensor 1C as a third embodiment of the invention will be described below. FIG. 14 is a perspective view showing a perspective configuration of the current sensor 1C. FIG. 15 shows a cross-sectional configuration in the direction indicated by the arrows (−X direction) along the line XV-XV of the current sensor 1C shown in FIG. 14.

The current sensor 1C can be obtained by adding a second mangetoresistive element 22, and a third thin film coil 33 (hereinafter referred to simply as a thin film coil 33) as a third conductor, to the current sensor 1A of the first embodiment. The third embodiment will be explained specifically, provided the description overlapping with the first embodiment has been left out of the following.

In the current sensor 1C, as shown in FIG. 14, the second magnetoresistive element 22 having element patterns 22A and 22B is disposed side by side in the Y-axis direction so as to be adjacent a first magnetoresistive element 21 in the second layer L2, and it is connected in series to the first magnetoresistive element 21. The element patterns 22A and 22B extend in the X-axis direction, and are disposed adjacent each other in the Y-axis direction and connected in parallel to each other. Additionally, the current sensor 1C is configured such that the thin film coil 33 winds in the first layer L1 while including turn portions 33A and 33B that extend in the X-axis direction in correspondence with the element patterns 22A and 22B, respectively. In other words, as shown in FIG. 15, the current sensor 1C has such a structure that the second layer L2 including the first and second magnetoresistive elements 21 and 22, and the first layer L1 including the thin film coils 31 and 33 are stacked in the order listed, via an underlayer 3 made of $Al_2O_3$ or the like, on a substrate 2 made of silicon or the like. In the cross section of FIG. 15, the first and second magnetoresistive elements 21, 22 and the thin film coils 31, 33 are covered with insulating films Z1 and Z2, respectively, which are made of $Al_2O_3$, or the like, and they are electrically isolated from each other. Furthermore, a plurality of electrode films 41 to 47 (shown in FIG. 14) are provided on the insulating film Z2.

The thin film coil 33 is a thin film pattern made of a high conductive metal material such as copper. One end 33S of the thin film coil 33 is connected via a contact hole (not shown) to the electrode film 45, and the other end 33E is connected via a contact hole (not shown) to the electrode film 46. It is set here such that a current Im flows from the end 33S to the end 33E.

Figure 16:
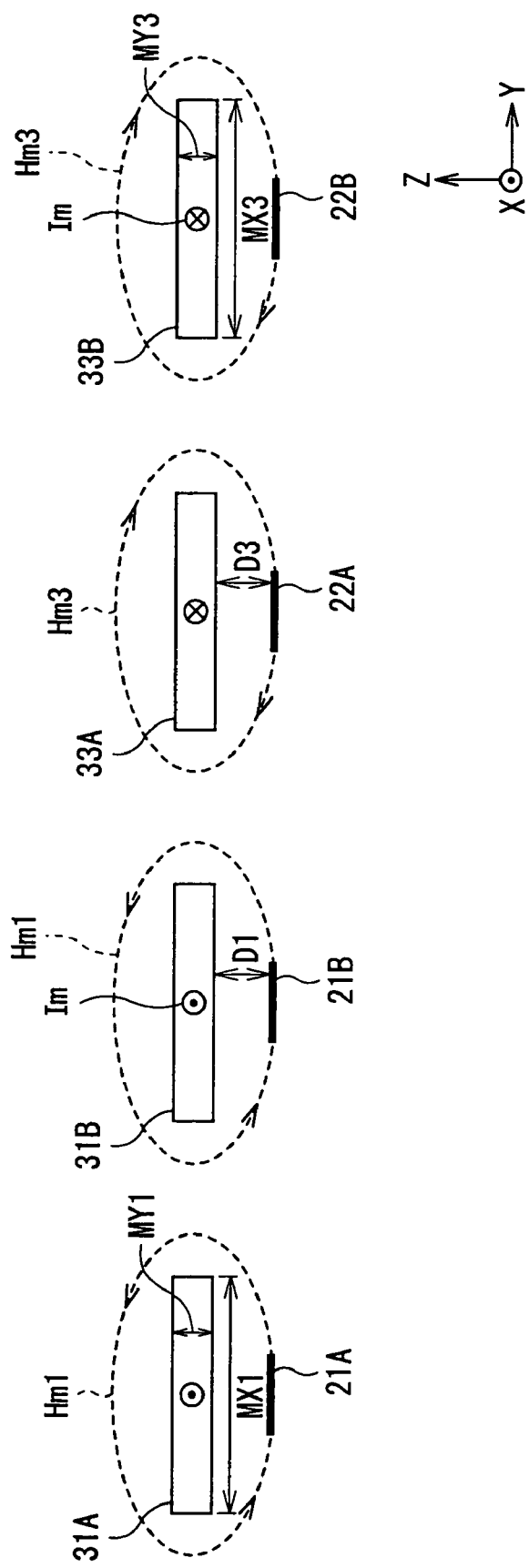
FIG. 16 is a sectional view showing in enlarged dimension an important part of FIG. 15.

The element patterns 22A and 22B are aimed at detecting a third magnetic field Hm3 (hereinafter referred to simply as a magnetic field Hm3) generated from a current Im and are disposed, in the stacking direction, at their respective corresponding areas with respect to the turn portions 33A and 33B of the thin film coil 33, as shown in FIG. 15. The element patterns 22A and 22B are disposed such that they extend in the X-axis direction and are adjacent each other in the Y-axis direction, and are connected in parallel by electrode patterns 5 and 6. Here, the electrode pattern 5 is connected via a contact hole (not shown) to the electrode film 44, and the electrode pattern 6 is connected via a contact hole (not shown) to the electrode film 47. When a read current is allowed to flow through the element patterns 22A and 22B, respectively, they undergo variations in resistance value according to a magnetic field Hm3 generated from a current Im flowing through the thin film coils 33A and 33B. It is so configured that, the element patterns 22A and 22B undergo variations in the resistance value in the opposite direction to the variations in the element patterns 21A and 21B which can be generated by a magnetic field Hm1. For example, a bias magnetic field having strength corresponding to a bias point BP1 (see FIG. 8) is previously applied in the +Y direction to the element patterns 21A, 21B, 22A, and 22B in the magnetoresistive elements 21 and 22. Thereafter, if a current Im is allowed to flow in the +X direction as shown in FIG. 16, the magnetic field Hm1 in the +Y direction can be applied to the element patterns 21A and 21B, so that the resistance change rate increases (the resistance value increases), as apparent from FIG. 8. On the other hand, a magnetic field Hm3 in the −Y direction can be applied to the element patterns 22A and 22B, so that the resistance change rate decreases (the resistance value decreases), as apparent from FIG. 8.

Here, the turn portions 31A, 31B and the element pattern 21A, 21B are disposed apart a distance D1 in the Z-axis direction, and the turn portions 32A, 32B and the element patterns 22A, 22B are disposed apart a distance D3 in the Z-axis direction. Each of the distances D1 and D3 is in the range of 0.4 µm to 1.0 µm (Conditional expressions 1 and 11). Each of the turn portions 31A and 31B has a rectangle cross section defined by a width MX1 and a thickness MY1, and has a cross-sectional area S1 (=MX1*MY1). Similarly, the turn portions 32A and 32B are shaped as a rectangle defined by a width MX3 and a thickness MY3, and have a cross-sectional area S3 (=MX3*MY3). Specifically, it is arranged such that each of the widths MX1 and MX2 is less than or equal to 3.0 µm, and each of the cross-sectional areas S1 and S3 is in the range of 0.4 µm² to 3.0 µm² (Conditional expressions 2 and 12). In consideration of accuracy during the process of formation, it is desirable to set the thickness MY1, MY3 more than or equal to 0.2 µm and less than or equal to the width MX1, MX3. Thus, the dimension in a YZ cross section of the thin film coil 31 is made equal to that of the thin film coil 33, and further the distance D1 in the stacking direction (the Z-axis direction) between the thin film coil 31 and the first magnetoresistive element 21 is made equal to the distance D3 between the thin film coil 33 and the second magnetoresistive element 22. Accordingly, the absolute value of the magnetic field Hm1 applied on the element patterns 21A and 21B is equal to that of the magnetic field Hm3 applied on the element patterns 22A and 22B. FIG. 16 shows in enlarged dimension part of FIG. 15, and it is an explanatory diagram for explaining the actions of the magnetic fields Hm1 and Hm3 on the element patterns 21A, 21B and the element patterns 22A, 22B, respectively.

Figure 17:
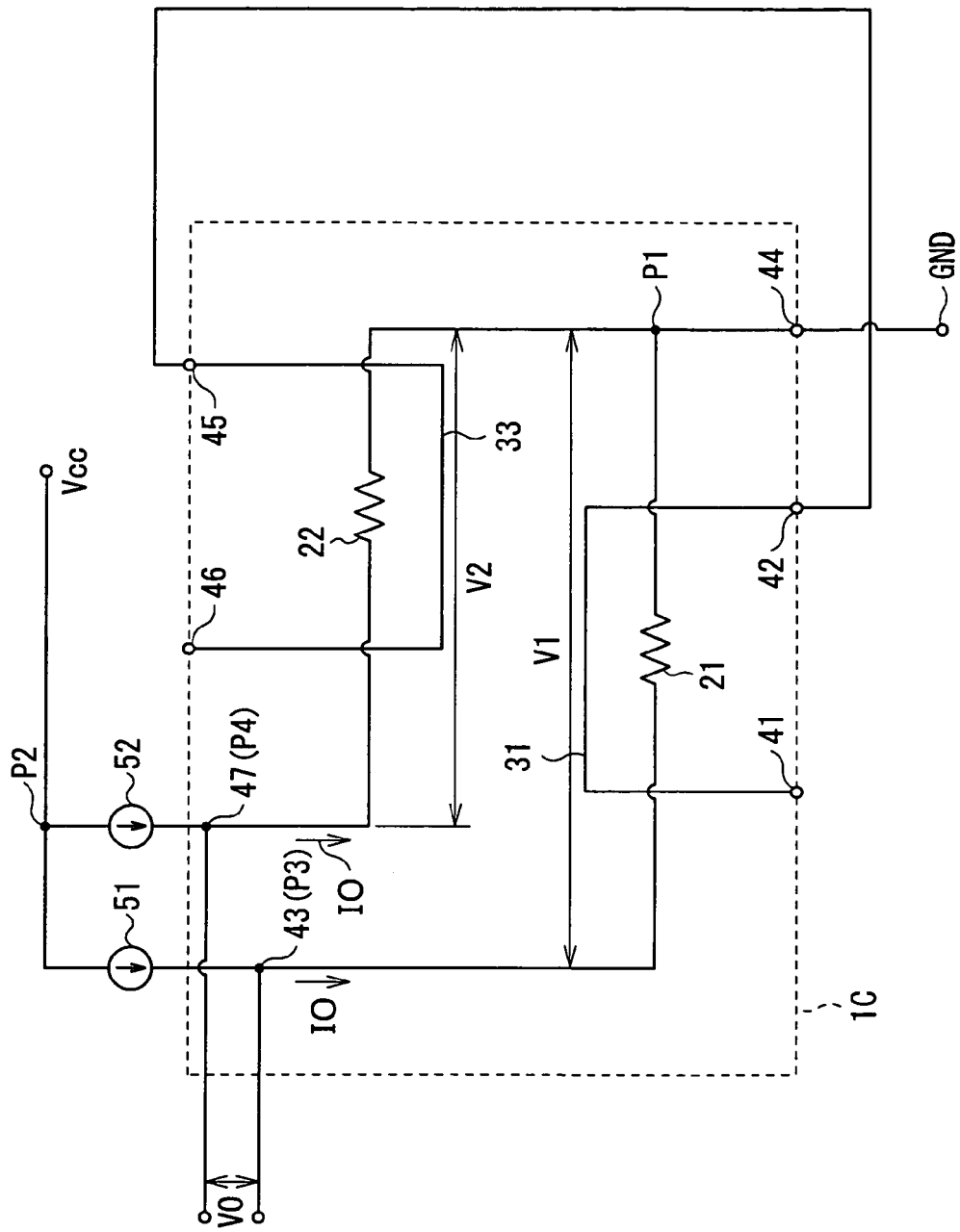
FIG. 17 is a circuit diagram of the current sensor shown in FIG. 14.

FIG. 17 is a schematic diagram illustrating a circuit configuration of an ammeter including the current sensor 1C shown in FIGS. 14 and 15. In FIG. 17, a portion surrounded by a broken line corresponds to the current sensor 1C. As shown in FIG. 17, the first magnetoresistive element 21 and the thin film coil 31 are disposed adjacent each other, and the second magnetoresistive element 22 and the thin film coil 33 are disposed adjacent each other. Here, each of the first and second magnetoresistive elements 21 and 22 is illustrated as a resistor that can be formed by connecting in parallel a plurality of element patterns. The first and second magnetoresistive elements 21 and 22 are commonly coupled at a first connection point P1 (the electrode pattern 5), and are finally grounded via the electrode film 44. Constant current sources 51 and 52 coupled to each other at a second connection point P2 are disposed on the side opposite to the first connection point P1 in the first and second magnetoresistive elements 21 and 22. Specifically, the end on the side opposite to the first connection point P1 in the first magnetoresistive elements 21 is connected to the constant current source 51 via the electrode film 43 functioning as a third connection point P3. The end on the side opposite to the first connection point P1 in the second magnetoresistive elements 22 is connected to the constant current source 52 via the electrode film 47 functioning as a fourth connection point P4. The constant current sources 51 and 52 supply equal constant current I0 to each element pattern of the first and second magnetoresistive elements 21 and 22. The thin film coils 31 and 33 are connected to each other with a conductor connecting the electrode films 42 and 45, thereby functioning as a single conductor line.

In the current sensor 1C so configured, the magnitudes of the magnetic fields Hm1 and Hm3 can be obtained on the basis of a potential difference V0 between the third and fourth connection points P3 and P4 (a difference between a couple of voltage drops generated in the first and second magnetoresistive elements 21 and 22) when a voltage is applied between the first and second connection points P1 and P2. This permits estimation of the magnitude of a current Im.

In FIG. 17, I0 is the constant currents from the constant current sources 51 and 52 when a predetermined voltage is applied between the first and second connection points P1 and P2, and R1 and R2 are the entire resistance value of the magnetoresistive elements 21 and 22, respectively. When no magnetic fields Hm1, Hm3 is being applied, a potential V1 at the third connection point P3 (the electrode film 43) can be expressed as follows.

$$V1 = I0 * R1$$

A potential V2 at the fourth connection point P4 (the electrode film 47) can be expressed as follows.

$$V2 = I0 * R2$$

Therefore, the potential difference between the third and fourth connection points P3 and P4 can be expressed as follows:

$$\begin{aligned} V0 &= V1 - V2 \\ &= I0 * R1 - I0 * R2 \\ &= I0 * (R1 - R2) \end{aligned} \qquad (a)$$

On this circuit, the resistance variations in the first and second magnetoresistive elements 21 and 22 can be obtained by measuring the potential difference V0 when the magnetic fields Hm1 and Hm3 are applied. For example, if the application of the magnetic fields Hm1 and Hm3 increases the resistance values R1 and R2 by the amount of variations ΔR1 and ΔR2, respectively, Equation (a) can be transformed as follows:

$$V0 = V1 - V2 \quad \text{(b)}$$
$$= I0 * (R1 - R2)$$
$$= I0 * \{(R1 + \Delta R1) - (R2 + \Delta R2)\}$$

As described above, the first magnetoresistive element 21 (the element patterns 21A and 21B) and the second magnetoresistive element 22 (the element patterns 22A and 22B) are arranged such that their respective resistance values R1, R2 vary in opposite directions each other in response to the magnetic fields Hm1, Hm3. This arrangement allows sign of the variations ΔR1 and ΔR2 to differ from each other. Therefore, in Equation (b), the resistance values R1 and R2 before the application of the magnetic fields Hm1 and Hm3 are cancelled, while the variations ΔR1 and ΔR2 remain.

If the first and second magnetoresistive elements 21 and 22 have the same characteristics, that is:

R1=R2=R, and

ΔR1=−ΔR2=ΔR

Equation (b) can be transformed as follows:

$$V0 = I0 * (R1 + \Delta R1 - R2 - \Delta R2) \quad \text{(c)}$$
$$= I0 * (R + \Delta R - R + \Delta R)$$
$$= I0 * (2\Delta R)$$

Therefore, the first and second magnetoresistive elements 21 and 22, where the relationship between an applied magnetic field and a resistance variation is known, makes it possible to find the magnitudes of the magnetic fields Hm1 and Hm3. This permits estimation of the magnitudes of a current Im. Since both of the first and second magnetoresistive elements 21 and 22 are used to perform sensing, it is capable of sensing resistance variations two times that in sensing with only one of the first and second magnetoresistive elements 21 and 22. This is advantageous for high-accuracy measured value.

Thus, the current sensor 1C of the third embodiment further includes: the second magnetoresistive element 22 formed in the second layer L2 and including the element patterns 22A and 22B connected in parallel; and the thin film coil 33 which is formed so as to wind in the first layer L1 while including the turn portions 32A and 32B in correspondence to the element patterns 22A and 22B, respectively, and which is configured to apply the magnetic field Hm3 on the element patterns 22A and 22B. This enables, besides the effects in the first embodiment, the current sensor 1C to measure a current with higher accuracy using both of the first and second magnetoresistive elements 21 and 22. It is configured here such that, upon the application of the magnetic field Hm3 on the element patterns 22A and 22B, the resistance value R2 varies in the opposite direction of the variations in the resistance value R1 of the element patterns 21A and 21B which can be caused by the magnetic field Hm1. This permits higher-accuracy measurement of a current Im on the basis of the difference V0 in voltage drop which can be caused when the same constant current I0 is allowed to flow through the first and second magnetoresistive elements 21 and 22.

Additionally, in the current sensor 1C of the third embodiment, each of the distances D1 and D3 is in the range of 0.4 µm to 1.0 µm, and each of the cross-sectional areas S1 and S2 is in the range of 0.4 µm² to 3.0 µm². Thereby, the magnetic fields Hm1 and Hm3 can be detected efficiently with reduction of the influence of the heat generated from the thin film coils 31 and 33. This permits high-accuracy measurement of a relatively weak current Im flowing through the thin film coils 31 and 33, which is in the range of 10 mA to 50 mA.

Modification 3

Although the third embodiment describes the case of measuring a current Im which is in the range of 10 mA to 50 mA, it is possible to configure a current sensor so as to measure a weaker current Im, for example, in the range of 3 mA to 50 mA. In this case, each of the distances D1 and D3 is in the range of 0.2 µm to 0.4 µm (Conditional expressions 3 and 9), and each of the cross-sectional areas S1 and S3 is in the range of 0.4 µm² to 2.5 µm² (Conditional expressions 4 and 10).

Thus, the current sensor 1C as a modification, which is configured to satisfy the conditional expressions 3, 4, 9, and 10, enables high-accuracy measurement of a current Im flowing through the thin film coils 31 and 33, which is in the range of 3 mA to 50 mA.

Fourth Embodiment

Figure 18:
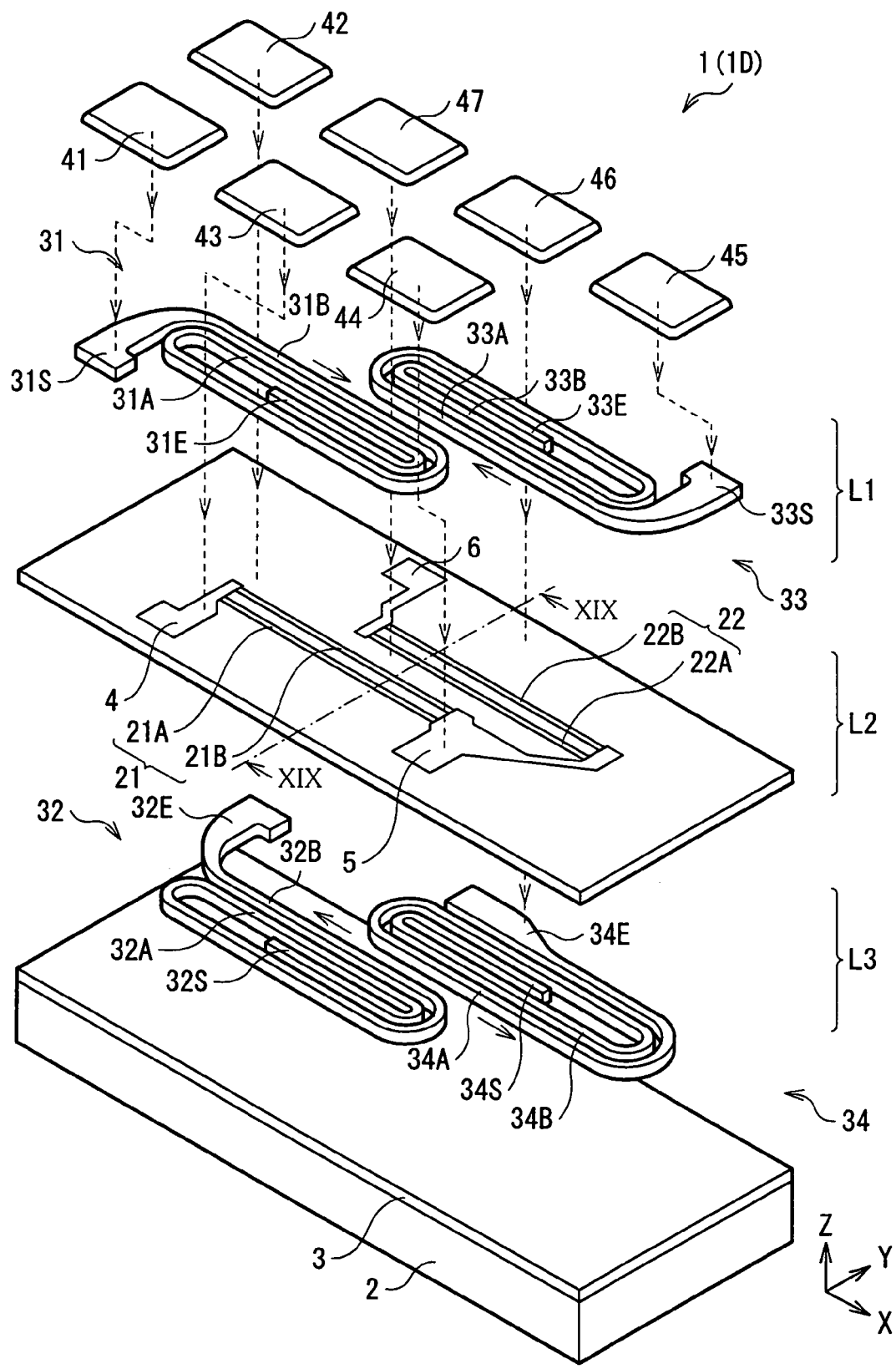
FIG. 18 is a perspective view showing the configuration of a current sensor according to a fourth embodiment of the invention.
Figure 19:
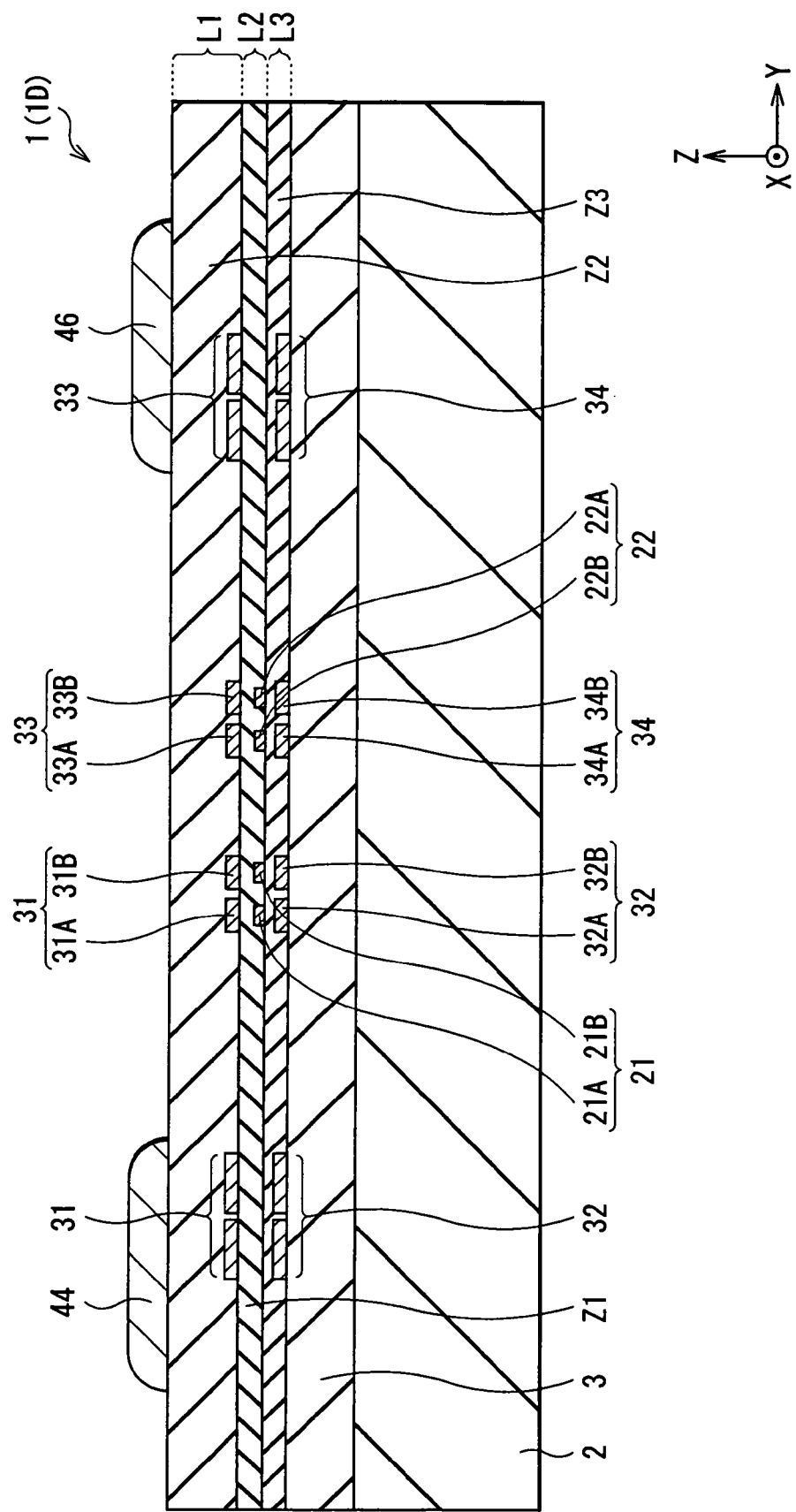
FIG. 19 is a sectional view taken along the line XIX-XIX of the current sensor shown in FIG. 18.

Reference to FIGS. 18 and 19, a current sensor 1D as a fourth embodiment of the invention will be described below.

The current sensor 1D can be obtained by adding a second thin film coil 32 as a second conductor, and a fourth thin film coil 34 as a fourth conductor (hereinafter referred to simply as a thin film coil 34) to the current sensor 1C of the third embodiment. The thin film coil 32 has the same configuration as that described in the second embodiment. The current sensor 1D of the fourth embodiment will be explained specifically, provided the descriptions overlapping with the first to third embodiments have been left out of the following.

FIG. 18 is a perspective view showing a perspective configuration of the current sensor 1D. FIG. 19 shows a cross-sectional configuration in the direction indicated by the arrows (−X direction) along the line XIX-XIX in the current sensor 1D of FIG. 18.

In the current sensor 1D, a second magnetoresistive element 22 is formed in an area other than the area where a first magnetoresistive element 21 is formed in the second layer L2. The second magnetoresistive element 22 includes element pattern 22A and 22B extending in the X-axis direction and being adjacent in the Y-axis direction and connected in parallel, and it is connected in series to the first magnetoresistive element 21. The thin film coil 34 is configured so as to wind in an area other than the area where the thin film coil 32 is formed at a third layer L3, on the side opposite to the thin film coil 33 with the second magnetoresistive element 22 interposed therebetween. In other words, as shown in FIG. 19, the current sensor ID has such a structure that the third layer L3 including the thin film coils 32 and 34, the second layer L2 including the first and second magnetoresistive elements 21 and 22, and the first layer L1 including the thin film coils 31 and 33 are stacked in the order listed, via an underlayer 3 made of Al$_2$O$_3$ or the like, on a substrate 2 made of silicon or the like. In the cross section of FIG. 19, the thin film coils 32, 34, the first and second magnetoresistive elements 21, 22, and the thin film coils 31, 33 are covered with insulating films Z3, Z1, and Z2, respectively, which are made of Al$_2$O$_3$ or the like, and they are electrically isolated from each other. Furthermore, a plurality of electrode films 41 to 47 (shown in FIG. 18) are provided on the insulating film Z2.

The thin film coil 33 is configured so as to apply the magnetic field Hm3 on the element patterns 22A and 22B under the supply of a current Im. One end 33S of the thin film coil 33 is connected via a contact hole (not shown) to an electrode film 45, and the other end 33E is connected via a contact hole (not shown) to an end 34S of the thin film coil 34 (see FIG. 18). The thin film coil 34 includes turn portions 34A and 34B that extend in the X-axis direction so as to correspond to the element patterns 22A and 22B, respectively. The thin film coil 34 is configured such that it applies a fourth magnetic field Hm4 that is the same in direction as the magnetic field Hm3 (hereinafter referred to simply as a magnetic field Hm4), on the element patterns 22A and 22B under the supply of a current Im. One end 34S of the thin film coil 34 is connected via a contact hole (not shown) to the end 33E, and the other end 34E is connected via a contact hole (not shown) to an electrode film 46 (see FIG. 18). Therefore, the thin film coils 33 and 34 configure a single conductor line in the circuit configuration. In an alternative, electrode films 42 and 45 may be connected to each other with an external conductor (not shown) such that the thin film coils 31 to 34 substantially function as a single conductor line. This allows a current Im to flow through the thin film coils 31, 32, 33, and 34 in the order listed or in the reverse order. Like the thin film coils 31 to 33, the thin film coil 34 is a thin film pattern made of a high conductive metal material such as copper.

Figure 20:
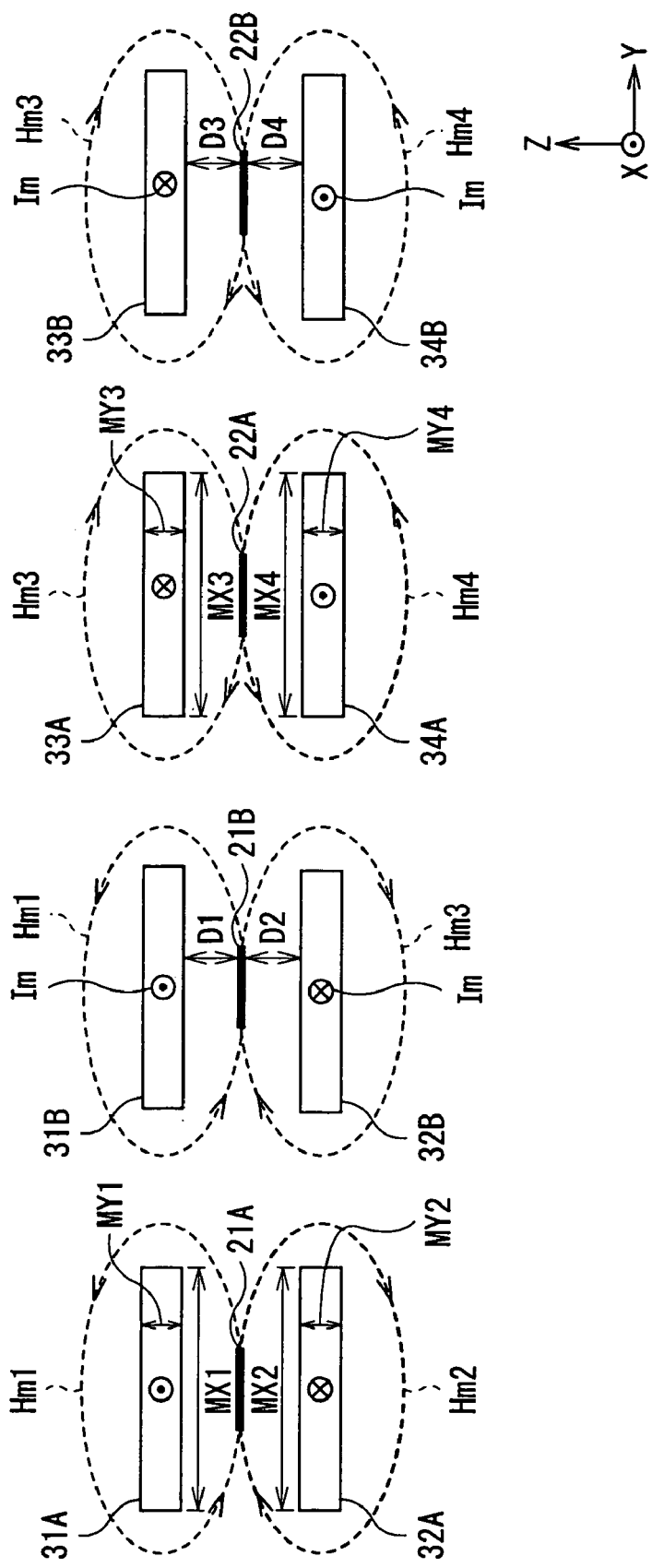
FIG. 20 is a sectional view showing in enlarged dimension a key part of FIG. 19.

In the current sensor 1D so configured, a current Im flowing through the thin film coils 31 and 32 causes the two magnetic fields Hm1 and Hm2 to act on the element patterns 21A and 21B, as shown in FIG. 20. At the same time, a current Im flowing through the thin film coils 33 and 34 causes the two magnetic fields Hm3 and Hm4 to act on the element patterns 22A and 22B. FIG. 20 shows in enlarged dimension part of FIG. 19, and it is an explanatory diagram for explaining the actions of the magnetic fields Hm1 and Hm2 on the element patterns 21A and 21B, respectively, and the actions of the magnetic fields Hm3 and Hm4 on the element patterns 22A and 22B, respectively. Here, the turn portions 32A, 32B and the element pattern 21A, 21B are disposed apart a distance D2 in the Z-axis direction, and the turn portions 34A, 34B and the element patterns 22A, 22B are disposed apart a distance D4 in the Z-axis direction. Each of the distances D2 and D4 is in the range of 0.4 μm to 1.0 μm (Conditional expressions 17 and 18). Consequently, all the distances D1 to D4 are in the same range. Each of the turn portions 32A and 32B has a rectangle cross section defined by a width MX2 and a thickness MY2, and has a cross-sectional area S2 (=MX2*MY2). Each of the turn portions 34A and 34B has a rectangle cross section defined by a width MX4 and a thickness MY4, and has a cross-sectional area S4 (=MX4*MY4). Specifically, like the cross-sectional areas S1 and S3, it is arranged such that each of the widths MX2 and MX4 is less than or equal to 3.0 μm, and each of the cross-sectional areas S2 and S4 is in the range of 0.4 μm$^2$ to 3.0 μm$^2$ (Conditional expressions 19 and 20). In consideration of accuracy during the process of formation, it is desirable to set the thickness MY2, MY4 at more than or equal to 0.2 μm and to be equal to or less than the width MX2, MX4.

In sensing with the current sensor 1D, first, a sense current is allowed to flow through the electrode films 43 and 44 to the first magnetoresistive element 21 (the element patterns 21A and 21B) and to the second magnetoresistive element 22 (the element patterns 22A and 22B). Then, a current Im is supplied via the electrode films 41 and 42 to the thin film coils 31 and 32 such that the element patterns 21A and 21B detect a magnetic field Hm1 generated from the turn portions 31A and 31B, and a magnetic field Hm2 generated from the turn portions 32A and 32B, respectively. Similarly, a current Im is supplied via the electrode films 45 and 46 to the thin film coils 33 and 34 such that the element patterns 22A and 22B detect a magnetic field Hm3 generated from the turn portions 33A and 33B, and a magnetic field Hm4 generated from the turn portions 34A and 34B, respectively.

Consider now for example the case where, with the electrode films 42 and 45 connected to each other by an external conductor, a current Im that has flown through the thin film coils 31 and 32 in this order is allowed to flow from the end 33S of the thin film coil 33 to the end 33E, and then from the end 34S of the thin film coil 34 to the end 34E. In this case, as shown in FIG. 20, the current Im will flow in the −X direction (from near side to far side as seen in FIG. 20) at the turn portions 33A and 33B. As a result, a magnetic field Hm3 is generated which winds (in a clockwise as seen in FIG. 20) the surroundings of the turn portions 33A and 33B, respectively, according to corkscrew rule. On the other hand, the current Im will flow in the +X direction (from far side to near side as seen in FIG. 20) at the turn portions 34A and 34B. As a result, a magnetic field Hm4 is generated which winds (in a counterclockwise as seen in FIG. 20) the surroundings of the turn portions 34A and 34B, respectively, according to corkscrew rule. Hence, a composite magnetic field of the magnetic fields Hm3 and Hm4 toward the −Y direction is supplied to each of the element patterns 22A and 22B. Therefore, the magnetic field strength applied on the element patterns 22A and 22B can be increased, resulting in greater variations in the resistance value than the case where only the magnetic field Hm3 is applied on the second magnetoresistive element 22, as in the third embodiment. Here, the magnitude of the current Im can be estimated with higher accuracy by detecting a difference between a variation in voltage drop (a variation in resistance value) between the electrode patterns 4 and 5, and that between the electrode patterns 5 and 6.

Thus, the current sensor 1D of the fourth embodiment is configured such that the first magnetoresistive element 21 detects the magnetic fields Hm1 and Hm2 which can be generated from a current Im, and such that the second magnetoresistive element 22 detects the magnetic fields Hm3 and Hm4 which can be generated from a current Im. With this configuration, the presence of the first and second magnetoresistive elements 21 and 22 permits higher-accuracy measurement of a current Im flowing through the thin film coils 31 to 34, while maintaining a compact configuration. Especially, the element patterns 22A and 22B are configured such that, upon the application of the magnetic fields Hm3 and Hm4, the resistance value varies in the opposite direction of the variations in the element patterns 21A and 21B of the first magnetoresistive element 21 which can be caused by the magnetic fields Hm1 and Hm2. Moreover, the same constant current 10 is allowed to flow through the first and second magnetoresistive elements 21 and 22. Therefore, based on a difference in voltage drop produced, a current Im can be measured with higher accuracy.

Additionally, in the current sensor 1D of the fourth embodiment, each of the distances D1 to D4 is in the range of 0.4 μm to 1.0 μm, and each of the cross-sectional areas S1 to S4 is in the range of 0.4 μm$^2$ to 3.0 μm$^2$. Thereby, the magnetic fields Hm1 to Hm4 can be detected efficiently with reduction of the influence of heat generated from the thin film coils 31 to 34. This permits high-accuracy measurement of a relatively weak current Im flowing through the thin film coils 31 to 34, which is in the range of 10 mA to 50 mA.

Modification 4

Although the fourth embodiment describes the case of measuring a current Im which is in the range of 10 mA to 50 mA, it is possible to configure a current sensor so as to measure a weaker current Im, for example, in the range of 3 mA to 50 mA. In this case, each of the distances D1 to D4 is in the range of 0.2 μm to 0.4 μm (Conditional expressions 3, 7, 13, and 14), and each of the cross-sectional areas S1 to S4 is in the range of 0.4 μm² to 2.5 μm² (Conditional expressions 4, 8, 15, and 16).

Thus, the current sensor 1D as a modification, which is configured so as to satisfy the conditional expressions 3, 4, 7, 8, and 13 to 16, enables the magnetic fields Hm1 to Hm4 to be detected efficiency with reduction of the influence of heat generated from the thin film coils 31 to 34. This permits high-accuracy measurement of a current Im flowing through the thin film coils 31 to 34, which is in the range of 3 mA to 50 mA.

EXAMPLES

The following is a numerical example of the current sensor of the invention. This example relates to a current sensor having the configuration corresponding to the first embodiment and its modification. Specifically, the strength (in average) of the magnetic field Hm1 exerted on the element pattern 21A, and the temperature variation ΔT of the element pattern 21A were simulated. Table 1 shows the results.

TABLE 1

| | Im [mA] | D1 [μm] | S1 [μm²] | Hm1 [×10³/4π A/m] | ΔT [° C.] |
|---|---|---|---|---|---|
| Com. Example 1-1 | 3 | 0.4 | 3.0 | 4 (NG) | — |
| Example 1-1 | 3 | 0.4 | 2.5 | 5 | <0.01 |
| Example 1-2 | 10 | 0.2 | 0.4 | 32 | 0.07 |
| Example 1-3 | 10 | 0.2 | 0.1 | 50 | 0.34 |
| Example 1-4 | 50 | 0.2 | 0.4 | 170 | 1.7 |
| Com. Example 1-2 | 50 | 0.2 | 0.32 | 180 | 2.2 (NG) |
| Com. Example 2-1 | 10 | 1.0 | 4.0 | <5 (NG) | — |
| Example 2-1 | 10 | 1.0 | 3.0 | 5 | <0.01 |
| Example 2-2 | 10 | 0.6 | 3.0 | 11 | <0.01 |
| Example 2-3 | 10 | 0.6 | 1.6 | 15 | 0.01 |
| Example 2-4 | 10 | 0.4 | 1.6 | 18 | 0.01 |
| Example 2-5 | 50 | 0.4 | 0.4 | 150 | 1.7 |
| Com. Example 2-2 | 50 | 0.4 | 0.32 | 160 | 2.2 (NG) |

In Table 1, Examples 1-1 to 1-4 correspond to the configuration of the modification in the first embodiment, and Examples 2-1 to 2-5 correspond to the configuration of the first embodiment. Comparative Examples 1-1, 1-2, 2-1, and 2-2 do not correspond to the present invention. The current Im [mA], distance D1 [μm], cross-sectional area S1 [μm²], magnetic field Hm1 [*10³/4π A/m], and temperature variation ΔT [° C.] of these samples are presented sequentially in left-to-right order.

Stable detecting operation in the current sensor of the embodiment requires more than or equal to 5 Oe (=5*10³/4π [A/m]) in the strength of a magnetic field Hm1 applied on the element pattern. Therefore, in detecting the weakest current Im that is 3 [mA], it is required that the distance D1 is 0.4 [μm] and the cross-sectional area S1 is less than or equal to 2.5 [μm²] (Example 1-1). When the cross-sectional area S1 was 3.0 [μm²], the strength of the magnetic field Hm1 was insufficient, resulting in 4*10³/4π [A/m] (Comparative Example 1-1). On the other hand, it was found that, when the current Im was 10 mA, setting the cross-sectional area S1 at more than or equal to 0.4 [μm²] enabled the temperature variation ΔT to be held at 1.7° C. even for the minimum distance D1 (D1=0.2 [μm]) (Example 1-4). It was also found that, if the cross-sectional area S1 was set at 0.32 [μm²], the temperature variation ΔT was 2.2° C., resulting in poor reliability of the current sensor (Comparative Example 1-2).

It was found that, when the distance D was 1.0 [μm] in detecting a current Im, namely 10 [mA], a magnetic field Hm1 of more than or equal to 5 Oe (=5*10³/4π [A/m]) could be obtained by setting the cross-sectional area S1 at less than or equal to 3.0 [μm²] (Example 2-1). Under the same conditions, when the cross-sectional area S1 was 4.0 [μm²], the strength of the magnetic field Hm1 was insufficient (Comparative Example 2-1). On the other hand, it was found that, when a current Im was the maximum, namely 50 mA, setting the cross-sectional area S1 at more than or equal to 0.4 [μm²] enabled the temperature variation ΔT to be held at 1.7° C. even for the minimum distance D1 (D1=0.4 [μm]) (Example 2-5). It was also found that, if the cross-sectional area S1 was set at 0.32 [μm²], the temperature variation ΔT was 2.2° C., resulting in poor reliability of the current sensor (Comparative Example 2-2).

It was confirmed that excellent measurements were possible with the configuration to satisfy Conditional expressions 1 and 2 in measuring a current Im of in the range of 10 mA to 50 mA, as well as with the configuration to satisfy Conditional expressions 3 and 4 in measuring a current Im of in the range of 3 mA to 50 mA.

While the present invention has been shown in several forms, it is not so limited but is susceptible of various changes and modifications without departing from the spirit and scope of the claimed invention. For example, although the above embodiments employ the magnetoresistive element having the spin valve structure in which the magnetization direction of the pinned layer and the direction of the easy axis of magnetization of the free layer coincide with each other, the invention should not be limited to this. In an alternative, there may be used a magnetoresistive element having such a spin value structure that the magnetization direction of a pinned layer and the easy axis of magnetization of a free layer are orthogonal to each other.

Although in the foregoing embodiments each of the first and second magnetoresistive elements is configured by two element patterns, without limiting to this, three or more element patterns may form the first and second magnetoresistive elements, respectively. In an alternative, each of the first and second magnetoresistive elements may be formed by an element pattern extending in a first direction, and each of first to fourth conductors may be formed to have first to fourth extended portions extending in the first direction, respectively. Also in this case, the above-mentioned effects are obtainable by having each of the distances D1 to D4 between each of the first to fourth extended portions and each of the first to fourth magnetoresistive elements, respectively, and each of the cross-sectional areas S1 to S4 of the first to fourth extended portions, respectively, fall in their respective predetermined numerical ranges.

Figure 21:
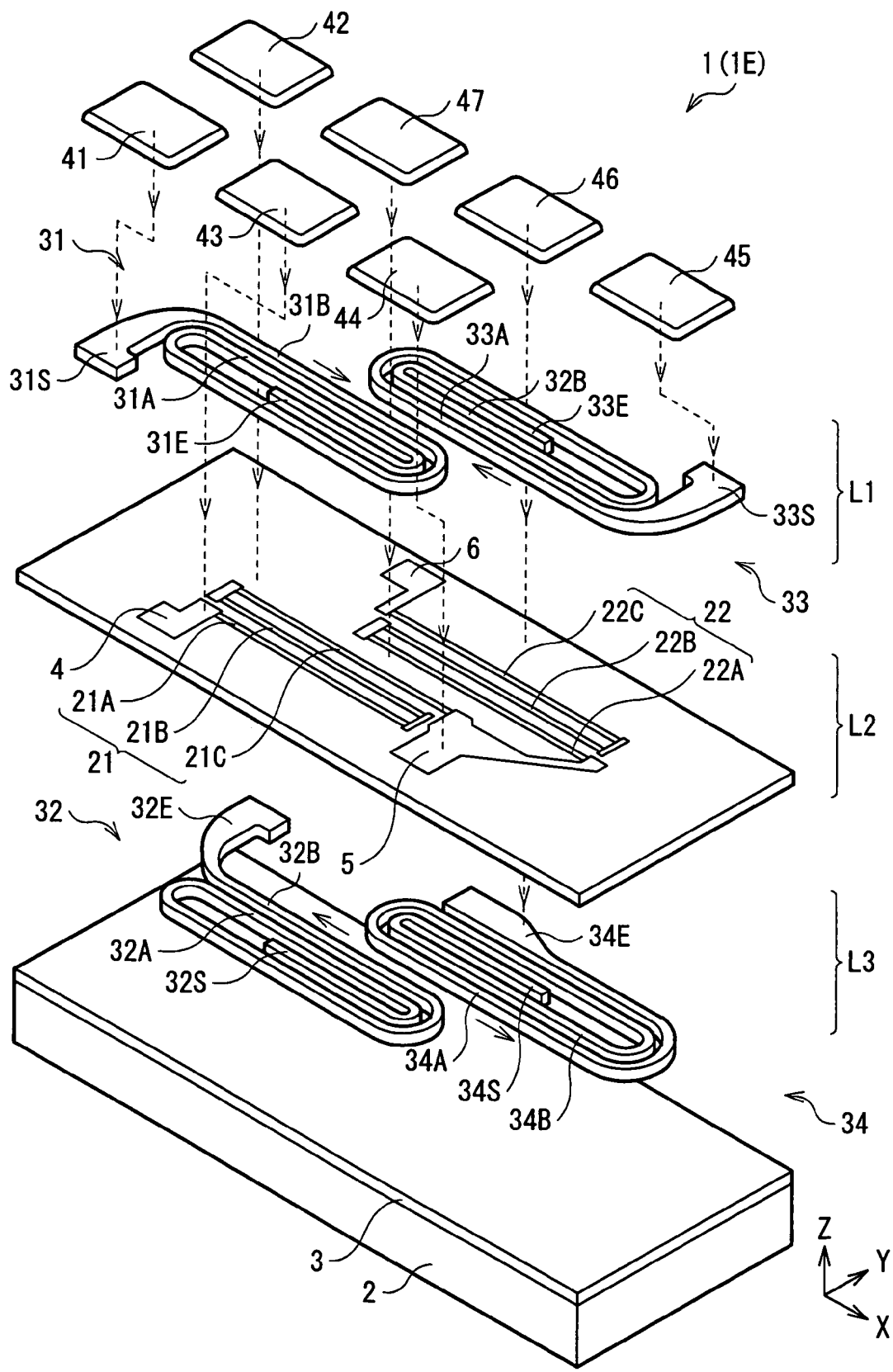
FIG. 21 is a perspective view showing the configuration of a modification of the current sensor shown in FIG. 18.

Although, in the above embodiments, the element patterns in the first and second magnetoresistive element are connected in parallel, they may be connected in series as in the current sensor 1E shown in FIG. 21. In this case, without increasing the dimension in the first direction, the whole extension length of the element patterns functioning as a magnetosensitive part is longer to further increase the absolute value of the whole resistance value (impedance) in the first and second magnetoresistive elements. This permits high-accurate measurements of a weak current.

The current sensors of the invention can be used to measure a current value itself as described in the foregoing embodiments, and are also applicable to an eddy current inspection technique for inspecting a defective on printed wiring, and the like. For example, the current sensor may include a plurality of magnetoresistive elements disposed in line in order to sense an eddy current change as a magnetic flux change.

What is claimed is:

1. A current sensor for detecting a current in the range of 10 mA to 50 mA, comprising:
    a first conductor disposed in a first layer, the first conductor having a first extended portion extending in a first direction and being supplied with the current; and
    a first magnetoresistive element disposed in a second layer in an area corresponding to the first extended portion, a resistance value of the first magnetoresistive element varying according to a first magnetic field generated by the current flowing through the first extended portion,
    the current sensor satisfying the following conditional expressions (1) and (2):

$$0.4 \ \mu m \leq D1 \leq 1.0 \ \mu m \quad (1)$$

$$0.4 \ \mu m^2 \leq S1 \leq 3.0 \ \mu m^2 \quad (2)$$

where D1 is a distance between a first extended portion and a first magnetoresistive element; and S1 is an area of a cross-section orthogonal to a first direction in the first extended portion.

2. The current sensor according to claim 1, further comprising:
    a second conductor disposed in a third layer located on a side opposite to the first layer with respective to the second layer, the second conductor having a second extended portion extending in the first direction in correspondence with the first magnetoresistive element and generating a second magnetic field through the current supplied, the second magnetic field then applied on the first magnetoresistive element in the same direction as the first magnetic field,
    the current sensor satisfying the following conditional expressions (5) and (6):

$$0.4 \ \mu m \leq D2 \leq 1.0 \ \mu m \quad (5)$$

$$0.4 \ \mu m^2 \leq S2 \leq 3.0 \ \mu m^2 \quad (6)$$

where D2 is a distance between a second extended portion and a first magnetoresistive element; and S2 is an area of a cross-section orthogonal to a first direction in the second extended portion.

3. The current sensor according to claim 2, wherein
    the first magnetoresistive element has a plurality of strip-shaped element patterns extending in the first direction and disposed adjacent each other in a second direction orthogonal to the first direction,
    the first conductor is a first thin film coil which winds in the first layer while including a plurality of turns as the first extended portion, each turn of the first thin film coil extending in the first direction in correspondence with each of the element patterns of the first magnetoresistive element, the first thin film coil generating the first magnetic field through the current supplied, the first magnetic field then applied on each of the element patterns of the first magnetoresistive element, and
    the second conductor is a second thin film coil which winds in the third layer while including a plurality of turns as the second extended portion, each turn of the second thin film coil extending in the first direction in correspondence with each of the element patterns of the first magnetoresistive element, the second thin film coil generating the second magnetic field through the current supplied, the second magnetic field then applied on each of the element patterns of the first magnetoresistive element.

4. The current sensor according to claim 3, wherein each of the element patterns in the first magnetoresistive element is in the range of 0.5 μm to 2.0 μm in a width orthogonal to the first direction.

5. The current sensor according to claim 1, wherein
    the first magnetoresistive element has a plurality of strip-shaped element patterns extending in the first direction and are disposed adjacent each other in a second direction orthogonal to the first direction,
    the first conductor is a first thin film coil which winds in the first layer while including a plurality of turns as the first extended portion, each turn of the first thin film coil extending in the first direction in correspondence with each of the element patterns of the first magnetoresistive element, the first thin film coil generating the first magnetic field through the current supplied, the first magnetic field then applied on each of the element patterns of the first magnetoresistive element.

6. The current sensor according to claim 5, wherein each of the element patterns in the first magnetoresistive element is in the range of 0.5 μm to 2.0 μm in a width orthogonal to the first direction.

7. The current sensor according to claim 1, further comprising:
    a third conductor disposed in the first layer, the third conductor having a third extended portion extending in the first direction in an area other than where the first conductor is formed and being supplied with the current; and
    a second magnetoresistive element disposed in the second layer in an area corresponding to the third extended portion and commonly connected to the first magnetoresistive element, a resistance value of the second magnetoresistive element varying according to a third magnetic field generated by the current flowing through the third extended portion,
    the current sensor satisfying the following conditional expressions (11) and (12):

$$0.4 \ \mu m \leq D3 \leq 1.0 \ \mu m \quad (11)$$

$$0.4 \ \mu m^2 \leq S3 \leq 3.0 \ \mu m^2 \quad (12)$$

where D3 is a distance between a third extended portion and a second magnetoresistive element; and S3 is an area of a cross-section orthogonal to a first direction in the third extended portion.

8. The current sensor according to claim 7, wherein a direction of a resistance value variation of the second magnetoresistive element produced through the third magnetic field is opposite to that of the first magnetoresistive element produced through the first magnetic field.

9. The current sensor according to claim 7, wherein each of the first and second magnetoresistive elements has a plurality of strip-shaped element patterns extending in the first direction and disposed adjacent each other in a second direction orthogonal to the first direction.

10. The current sensor according to claim 9, wherein each of the element patterns in the first and second magnetoresistive elements is in the range of 0.5 μm to 2.0 μm in a width orthogonal to the first direction.

11. The current sensor according to claim 9, wherein
the first conductor is a first thin film coil which winds in the first layer while including a plurality of turns as the first extended portion, each turn of the first thin film coil extending in the first direction in correspondence with each of the element patterns of the first magnetoresistive element, the first thin film coil generating the first magnetic field through the current supplied, the first magnetic field then applied on each of the element patterns of the first magnetoresistive element, and
the third conductor is a third thin film coil which winds in the first layer while including a plurality of turns as the third extended portion, each turn of the third thin film coil extending in the first direction in correspondence with each of the element patterns of the second magnetoresistive element, the third thin film coil generating the third magnetic field through the current supplied, the third magnetic field then applied on each of the element patterns of the second magnetoresistive element.

12. The current sensor according to claim 7, further comprising:
a second conductor disposed in a third layer located on a side opposite to the first layer with respective to the second layer, the second conductor having a second extended portion extending in the first direction in correspondence with the first magnetoresistive element and generating a second magnetic field through the current supplied, the second magnetic field then applied on the first magnetoresistive element in the same direction as the first magnetic field; and
a fourth conductor disposed in the third layer, located in an area other than where the second conductor is formed, the fourth conductor having a fourth extended portion extending in the first direction in correspondence with the second magnetoresistive element and generating a fourth magnetic field through the current supplied, the fourth magnetic field then applied on the second magnetoresistive element in the same direction as the third magnetic field,
the current sensor satisfying the following conditional expressions (17) to (20):

$$0.4 \text{ μm} \leq D2 \leq 1.0 \text{ μm} \quad (17)$$

$$0.4 \text{ μm} \leq D4 \leq 1.0 \text{ μm} \quad (18)$$

$$0.4 \text{ μm}^2 \leq S2 \leq 3.0 \text{ μm}^2 \quad (19)$$

$$0.4 \text{ μm}^2 \leq S4 \leq 3.0 \text{ μm}^2 \quad (20)$$

where D2 is a distance between a second extended portion and a first magnetoresistive element; S2 is an area of a cross-section orthogonal to a first direction in the second extended portion; D4 is a distance between a fourth extended portion and a second magnetoresistive element; and S4 is an area of a cross-section orthogonal to a first direction in the fourth extended portion.

13. The current sensor according to claim 12, wherein a direction of a resistance value variation of the second magnetoresistive element produced through the third and fourth magnetic fields is opposite to that of the first magnetoresistive element produced through the first and second magnetic fields.

14. The current sensor according to claim 12, wherein each of the first and second magnetoresistive elements has a plurality of strip-shaped element patterns extending in the first direction and are disposed adjacent each other in the second direction.

15. The current sensor according to claim 14, wherein each of the element patterns in the first and second magnetoresistive elements is in the range of 0.5 μm to 2.0 μm in a width orthogonal to the first direction.

16. The current sensor according to claim 14, wherein
the first conductor is a first thin film coil which winds in the first layer while including a plurality of turns as the first extended portion, each turn of the first thin film coil extending in the first direction in correspondence with each of the element patterns of the first magnetoresistive element, the first thin film coil generating the first magnetic field through the current supplied, the first magnetic field then applied on each of the element patterns of the first magnetoresistive element,
the second conductor is a second thin film coil which winds in the third layer while including a plurality of turns as the second extended portion, each turn of the second thin film coil extending in the first direction in correspondence with each of the element patterns of the first magnetoresistive element, the second thin film coil generating the second magnetic field through the current supplied, the second magnetic field then applied on each of the element patterns of the first magnetoresistive element,
the third conductor is a third thin film coil which winds in the first layer while including a plurality of turns as the third extended portion, each turn of the third thin film coil extending in the first direction in correspondence with each of the element patterns of the second magnetoresistive element, the third thin film coil generating the third magnetic field through the current supplied, the third magnetic field then applied on each of the element patterns of the second magnetoresistive element, and
the fourth conductor is a fourth thin film coil which winds in the third layer while including a plurality of turns as the fourth extended portion, each turn of the fourth thin film coil extending in the first direction in correspondence with each of the element patterns of the second magnetoresistive element, the fourth thin film coil generating the fourth magnetic field through the current supplied, the fourth magnetic field then applied on each of the element patterns of the second magnetoresistive element.

17. A current sensor for detecting a current in the range of 3 mA to 50 mA, comprising:
a first conductor disposed in a first layer, the first conductor having a first extended portion extending in a first direction and being supplied with the current; and
a first magnetoresistive element disposed in a second layer in an area corresponding to the first extended portion, a resistance value of the first magnetoresistive element varying according to a first magnetic field generated by the current flowing through the first extended portion,
the current sensor satisfying the following conditional expressions (3) and (4):

$$0.2 \text{ μm} \leq D1 \leq 0.4 \text{ μm} \quad (3)$$

$$0.4 \text{ μm}^2 \leq S1 \leq 2.5 \text{ μm}^2 \quad (4)$$

where D1 is a distance between a first extended portion and a first magnetoresistive element; and S1 is an area of a cross-section orthogonal to a first direction in the first extended portion.

18. The current sensor according to claim 17, further comprising:
a second conductor disposed in a third layer located on a side opposite to the first layer with respective to the second layer, the second conductor having a second extended portion extending in the first direction in correspondence with the first magnetoresistive element and generating a second magnetic field through the current supplied, the second magnetic field then applied on the first magnetoresistive element in the same direction as the first magnetic field,
the current sensor satisfying the following conditional expressions (7) and (8):

$$0.2 \ \mu m \leq D2 \leq 0.4 \ \mu m \quad (7)$$

$$0.4 \ \mu m^2 \leq S2 \leq 2.5 \ \mu m^2 \quad (8)$$

where D2 is a distance between a second extended portion and a first magnetoresistive element; and S2 is an area of a cross-section orthogonal to a first direction in the second extended portion.

19. The current sensor according to claim 18, wherein
the first magnetoresistive element has a plurality of strip-shaped element patterns extending in the first direction and disposed adjacent each other in a second direction orthogonal to the first direction,
the first conductor is a first thin film coil which winds in the first layer while including a plurality of turns as the first extended portion, each turn of the first thin film coil extending in the first direction in correspondence with each of the element patterns of the first magnetoresistive element, the first thin film coil generating the first magnetic field through the current supplied, the first magnetic field then applied on each of the element patterns of the first magnetoresistive element, and
the second conductor is a second thin film coil which winds in the third layer while including a plurality of turns as the second extended portion, each turn of the second thin film coil extending in the first direction in correspondence with each of the element patterns of the first magnetoresistive element, the second thin film coil generating the second magnetic field through the current supplied, the second magnetic field then applied on each of the element patterns of the first magnetoresistive element.

20. The current sensor according to claim 19, wherein each of the element patterns in the first magnetoresistive element is in the range of 0.5 μm to 2.0 μm in a width orthogonal to the first direction.

21. The current sensor according to claim 17, wherein
the first magnetoresistive element has a plurality of strip-shaped element patterns extending in the first direction and are disposed adjacent each other in a second direction orthogonal to the first direction,
the first conductor is a first thin film coil which winds in the first layer while including a plurality of turns as the first extended portion, each turn of the first thin film coil extending in the first direction in correspondence with each of the element patterns of the first magnetoresistive element, the first thin film coil generating the first magnetic field through the current supplied, the first magnetic field then applied on each of the element patterns of the first magnetoresistive element.

22. The current sensor according to claim 21, wherein each of the element patterns in the first magnetoresistive element is in the range of 0.5 μm to 2.0 μm in a width orthogonal to the first direction.

23. The current sensor according to claim 17, further comprising:
a third conductor disposed in the first layer, the third conductor having a third extended portion extending in the first direction in an area other than where the first conductor is formed and being supplied with the current; and
a second magnetoresistive element disposed in the second layer in an area corresponding to the third extended portion and commonly connected to the first magnetoresistive element, a resistance value of the second magnetoresistive element varying according to a third magnetic field generated by the current flowing through the third extended portion,
the current sensor satisfying the following conditional expressions (9) and (10):

$$0.2 \ \mu m \leq D3 \leq 0.4 \ \mu m \quad (9)$$

$$0.4 \ \mu m^2 \leq S3 \leq 2.5 \ \mu m^2 \quad (10)$$

where D3 is a distance between a third extended portion and a second magnetoresistive element; and S3 is an area of a cross-section orthogonal to a first direction in the third extended portion.

24. The current sensor according to claim 23, wherein a direction of a resistance value variation of the second magnetoresistive element produced through the third magnetic field is opposite to that of the first magnetoresistive element produced through the first magnetic field.

25. The current sensor according to claim 23, wherein each of the first and second magnetoresistive elements has a plurality of strip-shaped element patterns extending in the first direction and disposed adjacent each other in a second direction orthogonal to the first direction.

26. The current sensor according to claim 25, wherein each of the element patterns in the first and second magnetoresistive elements is in the range of 0.5 μm to 2.0 μm in a width orthogonal to the first direction.

27. The current sensor according to claim 25, wherein
the first conductor is a first thin film coil which winds in the first layer while including a plurality of turns as the first extended portion, each turn of the first thin film coil extending in the first direction in correspondence with each of the element patterns of the first magnetoresistive element, the first thin film coil generating the first magnetic field through the current supplied, the first magnetic field then applied on each of the element patterns of the first magnetoresistive element, and
the third conductor is a third thin film coil which winds in the first layer while including a plurality of turns as the third extended portion, each turn of the third thin film coil extending in the first direction in correspondence with each of the element patterns of the second magnetoresistive element, the third thin film coil generating the third magnetic field through the current supplied, the third magnetic field then applied on each of the element patterns of the second magnetoresistive element.

28. The current sensor according to claim 23, further comprising:
a second conductor disposed in a third layer located on a side opposite to the first layer with respective to the second layer, the second conductor having a second extended portion extending in the first direction in correspondence with the first magnetoresistive element and generating a second magnetic field through the current supplied, the second magnetic field then applied on the first magnetoresistive element in the same direction as the first magnetic field; and a fourth conductor disposed in the third layer, located in an area other than where the second conductor is formed, the fourth conductor having a fourth extended portion extending in the first direction in correspondence with the second magnetoresistive element and generating a fourth magnetic field through the current supplied, the fourth magnetic field then applied on the second magnetoresistive element in the same direction as the third magnetic field, the current sensor satisfying the following conditional expressions (13) to (16):

$$0.2\ \mu m \leq D2 \leq 0.4\ \mu m \tag{13}$$

$$0.2\ \mu m \leq D4 \leq 0.4\ \mu m \tag{14}$$

$$0.4\ \mu m^2 \leq S2 \leq 2.5\ \mu m^2 \tag{15}$$

$$0.4\ \mu m^2 \leq S4 \leq 2.5\ \mu m^2 \tag{16}$$

where D2 is a distance between a second extended portion and a first magnetoresistive element; S2 is an area of a cross-section orthogonal to a first direction in the second extended portion; D4 is a distance between a fourth extended portion and a second magnetoresistive element; and S4 is an area of a cross-section orthogonal to a first direction in the fourth extended portion.

29. The current sensor according to claim 28, wherein a direction of a resistance value variation of the second magnetoresistive element produced through the third and fourth magnetic fields is opposite to that of the first magnetoresistive element produced through the first and second magnetic fields.

30. The current sensor according to claim 28, wherein each of the first and second magnetoresistive elements has a plurality of strip-shaped element patterns extending in the first direction and are disposed adjacent each other in the second direction.

31. The current sensor according to claim 30, wherein each of the element patterns in the first and second magnetoresistive elements is in the range of 0.5 µm to 2.0 µm in a width orthogonal to the first direction.

32. The current sensor according to claim 30, wherein the first conductor is a first thin film coil which winds in the first layer while including a plurality of turns as the first extended portion, each turn of the first thin film coil extending in the first direction in correspondence with each of the element patterns of the first magnetoresistive element, the first thin film coil generating the first magnetic field through the current supplied, the first magnetic field then applied on each of the element patterns of the first magnetoresistive element, the second conductor is a second thin film coil which winds in the third layer while including a plurality of turns as the second extended portion, each turn of the second thin film coil extending in the first direction in correspondence with each of the element patterns of the first magnetoresistive element, the second thin film coil generating the second magnetic field through the current supplied, the second magnetic field then applied on each of the element patterns of the first magnetoresistive element, the third conductor is a third thin film coil which winds in the first layer while including a plurality of turns as the third extended portion, each turn of the third thin film coil extending in the first direction in correspondence with each of the element patterns of the second magnetoresistive element, the third thin film coil generating the third magnetic field through the current supplied, the third magnetic field then applied on each of the element patterns of the second magnetoresistive element, and the fourth conductor is a fourth thin film coil which winds in the third layer while including a plurality of turns as the fourth extended portion, each turn of the fourth thin film coil extending in the first direction in correspondence with each of the element patterns of the second magnetoresistive element, the fourth thin film coil generating the fourth magnetic field through the current supplied, the fourth magnetic field then applied on each of the element patterns of the second magnetoresistive element.

\* \* \* \* \*